United States Patent
Shen et al.

(10) Patent No.: US 12,224,146 B2
(45) Date of Patent: Feb. 11, 2025

(54) EMBEDDED SUBSTRATE, CIRCUIT BOARD ASSEMBLY, AND ELECTRONIC DEVICE

(71) Applicant: HUAWEI TECHNOLOGIES CO., LTD., Guangdong (CN)

(72) Inventors: Chao Shen, Shanghai (CN); Zhiqiang Xiang, Shenzhen (CN); Xiaojing Liao, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 230 days.

(21) Appl. No.: 17/955,796

(22) Filed: Sep. 29, 2022

(65) Prior Publication Data

US 2023/0028233 A1    Jan. 26, 2023

Related U.S. Application Data

(63) Continuation of application No. PCT/CN2020/082148, filed on Mar. 30, 2020.

(51) Int. Cl.
*H01H 85/046* (2006.01)
*H01H 85/06* (2006.01)
*H05K 1/18* (2006.01)

(52) U.S. Cl.
CPC ........ *H01H 85/046* (2013.01); *H01H 85/06* (2013.01); *H05K 1/181* (2013.01); *H05K 1/188* (2013.01)

(58) Field of Classification Search
CPC ...... H01H 85/046; H01H 85/06; H05K 1/181; H05K 1/188; H05K 1/0257; H05K 2201/10181; H01L 23/5256; H01L 23/62
See application file for complete search history.

(56) References Cited

U.S. PATENT DOCUMENTS 3,715,698 A * 2/1973 Blewitt ................ H01H 85/055
                                                337/233
4,041,435 A * 8/1977 Gaia ...................... H01H 85/10
                                                337/159

(Continued)

FOREIGN PATENT DOCUMENTS

CN          1551276 A    12/2004
CN        102792410 A    11/2012

(Continued)

OTHER PUBLICATIONS

Jin Jae Eun, "Clad Multistage Burning Fuse", Jun. 22, 2016, Hyundai Motor Co. LTD, Entire Document (Translation of KR 20160071574). (Year: 2016).*

(Continued)

*Primary Examiner* — Stephen S Sul

(57) ABSTRACT

This application provides an embedded substrate, a circuit board assembly, and an electronic device. The embedded substrate in this application includes an insulation layer, and an electronic element and a conductive connector that are embedded inside the insulation layer. The conductive connector is electrically connected to the electronic element. The conductive connector includes at least one fuse unit, each of the at least one fuse unit includes a fusible structure and two electrical connection ends, the fusible structure is connected between the two electrical connection ends in a direction of an electrical path of the conductive connector, and the fusible structure is configured to be blown when a passing current exceeds a preset current threshold, to disconnect an electrical connection between the electronic element and an external connection end. In this application, maintenance and replacement costs are low during current burning prevention, and a volume is compact.

23 Claims, 11 Drawing Sheets

(56) References Cited

U.S. PATENT DOCUMENTS

| | | | | |
|---|---|---|---|---|
| 5,644,281 | A * | 7/1997 | Kuriyama | H01H 85/0411 |
| | | | | 361/534 |
| 7,348,872 | B1 * | 3/2008 | Parry | H01H 85/12 |
| | | | | 337/228 |
| 8,080,861 | B2 * | 12/2011 | Tsuda | H01L 23/5256 |
| | | | | 438/281 |
| 10,978,267 | B2 * | 4/2021 | Douglass | H01H 85/38 |
| 2005/0218516 | A1 * | 10/2005 | Lloyd | H05K 1/141 |
| | | | | 257/738 |
| 2008/0230910 | A1 | 9/2008 | Gospodinova-Daltcheva et al. | |
| 2010/0164677 | A1 * | 7/2010 | Yang | H01H 85/12 |
| | | | | 337/159 |
| 2010/0245024 | A1 * | 9/2010 | Furuuchi | H01H 85/463 |
| | | | | 361/104 |
| 2015/0294829 | A1 * | 10/2015 | Fernández | H01H 85/38 |
| | | | | 337/227 |
| 2019/0006282 | A1 * | 1/2019 | Eid | H01L 23/49838 |
| 2019/0304859 | A1 * | 10/2019 | Otsubo | H01L 23/24 |
| 2019/0304893 | A1 * | 10/2019 | Dorgan | H01L 21/77 |
| 2020/0135667 | A1 * | 4/2020 | Lin | H01L 24/17 |
| 2021/0005550 | A1 * | 1/2021 | Chavali | H05K 1/181 |

FOREIGN PATENT DOCUMENTS

| | | | |
|---|---|---|---|
| CN | 205911276 U | 1/2017 | |
| CN | 110310930 A | 10/2019 | |
| JP | 2007250347 A | 9/2007 | |
| KR | 20160071574 A * | 6/2016 | H01H 85/143 |
| WO | 2019217741 A1 | 11/2019 | |

OTHER PUBLICATIONS

He Changwei; Wang Haifeng; Chen Yi, "Slimming protecting component", Jan. 25, 2017, Dongguan Huaheng Electronics Co LTD, Entire Document (Translation of CN 205911276) (Year: 2017).*

International Search Report and Written Opinion issued in PCT/CN2020/082148, dated Jan. 5, 2021, 9 pages.

Extended European Search Report issued in EP20929025.3, dated Jun. 19, 2023, 12 pages.

* cited by examiner

EMBEDDED SUBSTRATE, CIRCUIT BOARD ASSEMBLY, AND ELECTRONIC DEVICE

CROSS-REFERENCE TO RELATED APPLICATION

This application is a continuation of International Application No. PCT/CN2020/082148, filed on Mar. 30, 2020, the disclosure of which is hereby incorporated by reference in its entirety.

TECHNICAL FIELD

This application relates to the field of electronic devices, and in particular, to an embedded substrate, a circuit board assembly, and an electronic device.

BACKGROUND

As an electronic product is increasingly light, thin, and miniaturized, packaging integration of electronic elements inside the electronic product is increasingly high, and an embedded substrate in which the electronic elements are embedded inside a circuit board is increasingly widely applied.

Currently, when the embedded substrate is applied to an electronic product, the embedded substrate may be disposed on the circuit board of the electronic product, and another electronic element may also be disposed on the circuit board. To protect the embedded substrate on the circuit board, a fuse tube is further disposed on the circuit board. The fuse tube is connected to an electrical path of the circuit board. When an excessively large current passes through the embedded substrate, a fuse in the fuse tube is blown, to disconnect an electrical connection between the embedded substrate and the circuit board, and protect the embedded substrate and the circuit board. Generally, the fuse tube may be tiled on the circuit board with the embedded substrate.

However, because the fuse in the fuse tube is blown and generates a high temperature, another component on the circuit board may be blown. This causes the entire circuit board to be scrapped. In addition, the fuse tube occupies a specific space on the circuit board. Therefore, a volume of the circuit board is increased.

SUMMARY

This application provides an embedded substrate, a circuit board assembly, and an electronic device. In this application, maintenance and replacement costs are low during current burning prevention, and a volume is compact.

According to a first aspect, this application provides an embedded substrate, including an insulation layer, an electronic element, and a conductive connector. The electronic element and the conductive connector are embedded inside the insulation layer, the conductive connector is electrically connected to the electronic element, and the conductive connector includes an external connection end for transmitting an electrical signal to the electronic element. The conductive connector includes at least one fuse unit, each of the at least one fuse unit includes a fusible structure and two electrical connection ends, the fusible structure is connected between the two electrical connection ends in a direction of an electrical path of the conductive connector, and the fusible structure is configured to be blown when a passing current exceeds a preset current threshold, to disconnect an electrical connection between the electronic element and the external connection end.

In this way, the fuse unit is disposed on the embedded substrate, and when an excessively large current passes through the fuse unit, the fuse unit is blown to protect the circuit. Because a blown position is located on the embedded substrate, only the embedded substrate may be affected by a high temperature generated when the fuse unit is blown, and another electronic component in a circuit board assembly is not damaged due to the high temperature generated when the fuse unit is blown. In this way, if the embedded substrate is blown due to current overload, only the embedded substrate needs to be repaired or replaced, and another electronic component on the circuit board can still work normally. Therefore, maintenance and replacement costs are low. In addition, because the fuse unit is integrated on the embedded substrate, no extra space of the circuit board is occupied, and a volume of the circuit board is compact.

In an optional implementation, the fusible structure is exposed on an outer surface of the insulation layer. In this way, the fusible structure may be directly disposed on the outer surface of the insulation layer through printing, etching, or the like. Therefore, processing and manufacturing are convenient. In addition, even if the fusible structure is blown, a blown position is located on a surface layer of the embedded substrate, to facilitate cleaning or repairing of the blown position.

In an optional implementation, the insulation layer includes a first insulation layer and a second insulation layer that are disposed in a stacked manner, and the second insulation layer includes a hollow area; and the electronic element and the conductive connector are embedded in the first insulation layer, the fuse unit is located on a surface that is of the first insulation layer and that faces the second insulation layer, and the fuse unit is exposed in the hollow area.

In an optional implementation, the fusible structure fills at least a part of the hollow area. In this way, a filling range of the fusible structure in the hollow area may be adjusted, to correspondingly control a usage amount of the fusible structure.

In an optional implementation, the fusible structure is a fusible conductive material, the two electrical connection ends are spaced apart in the direction of the electrical path of the conductive connector, and the fusible structure is connected between the two electrical connection ends. In such a disposing manner, the electrical connection ends of the conductive connector impose few limitations on a material and a structure form of the fusible conductive material, and the fusible conductive material is in a free form.

In an optional implementation, an accommodating space that can accommodate the fusible conductive material is formed between the two electrical connection ends in the fuse unit, and the fusible conductive material is disposed in the accommodating space. In this way, the accommodating space is formed between the electrical connection ends, and the fusible conductive material may be disposed in the accommodating space. In addition, the fusible conductive material works reliably, and does not easily interfere with or touch another part of the conductive connector.

In an optional implementation, the two electrical connection ends in the fuse unit jointly define the accommodating space.

In an optional implementation, two spaced first insulators are disposed between the two electrical connection ends, a spacing between the two first insulators is less than a width of a remaining part of the fusible conductive material in the direction of the electrical path, and a part that is of the fusible conductive material and that is located between the two first insulators forms a partition point. In this way, after the fusible conductive material is blown, the fusible conductive material is blocked by the first insulator, and is not reconnected. Therefore, the fusible conductive material has high reliability. In addition, because the spacing between the first insulators is small, a cross-sectional area of the fusible conductive material in the electrical path may also be small. When a large current passes through the electrical path, the fusible conductive materials may be first blown. In this way, a specific position at which the fusible conductive material is blown is further disposed by disposing the partition point.

In an optional implementation, the two electrical connection ends in the fuse unit are disposed opposite to each other; and the fuse unit further includes a second insulator, the second insulator is provided with the accommodating space, and the accommodating space is connected to the two electrical connection ends.

In an optional implementation, the second insulator includes a protruding part protruding into the accommodating space, so that the fusible conductive material forms a partition point at a position corresponding to the protruding part. In this way, the fusible conductive material has a small cross-sectional area at the partition point, and correspondingly, the fusible conductive material may be blown at the partition point. After the fusible conductive material is blown, the fusible conductive material is divided into two parts, and the two parts may maintain a state of being disconnected from each other, to prevent the fusible conductive material from re-approaching and contacting each other in a fused state. In addition, a specific position at which the fusible conductive material is blown is further disposed by disposing the partition point.

In an optional implementation, the accommodating space is a roundabout channel, and the fusible conductive material is filled at least in the roundabout channel. In this way, when space occupied by the accommodating space is small, a large contact area is provided between the fusible conductive material and the electrical connection ends. Therefore, it can be ensured that the fuse unit forms a normal and reliable electrical path in a normal working state.

In an optional implementation, the roundabout channel is in a hollow-out shape or a maze shape. In this way, a contact area as large as possible is formed between the fusible conductive material and the electrical connection ends in a small accommodating space.

In an optional implementation, the fusible conductive material is a colloidal object including a metal particle, and a melting point of the metal particle is lower than a melting point of the conductive connector. In this case, the fusible conductive material is the colloidal object. Therefore, the fusible conductive material can be flexibly and conveniently disposed between the two electrical connection ends of the fuse unit, and the two electrical connection ends are connected by using conductivity of the metal particle. When a large current passes through the electrical path in the embedded substrate, the fusible conductive material is blown earlier than the another part of the conductive connector, so that the circuit of the embedded substrate is disconnected, to protect the embedded substrate and the entire circuit board.

In an optional implementation, the fusible conductive material is solder paste. Tin has a low melting point and low resistivity. Therefore, as a fusible conductive material of the solder paste, the tin has a low melting point and good conductivity, can keep an electrical path of the fuse unit conducted when the embedded substrate works normally, and has a disconnection function when an excessively large current passes through the embedded substrate.

In an optional implementation, the fusible conductive material is printed and cured on the surface of the insulation layer. In this way, the fusible conductive material may be conveniently disposed in a plurality of different shapes and patterns.

In an optional implementation, the fusible structure is a fusible part that is integrally connected between the two electrical connection ends, and a cross-sectional area of the fusible structure in a direction perpendicular to the electrical path is less than a cross-sectional area of the another part of the conductive connector in the direction perpendicular to the electrical path.

In this case, the two electrical connection ends in the fuse unit are not disconnected, but are connected by using the fusible part. Therefore, electrical path connectivity can be maintained between the electrical connection ends. Therefore, when a large current passes through the electrical path, the fusible part is blown earlier than the another part of the conductive connector, to disconnect an electrical connection of the embedded substrate. Therefore, the embedded substrate and the entire circuit board are protected.

In an optional implementation, a nick is provided on a side of the fusible part, to form a partition point at the nick of the fusible part. When a large current passes through the electrical path of the fuse unit, a position corresponding to the nick of the fusible part is first blown, and a shrinkage phenomenon occurs at the nick. In this case, a position corresponding to the nick of the fusible part shrinks inwards, and the fusible part is not reconnected.

In an optional implementation, the fusible part is a metal component. In this way, the fusible part and the another part of the conductive connector can conveniently form an integrated structure.

In an optional implementation, there are at least two fuse units; and the fuse units are connected in parallel to the electrical path of the conductive connector, and/or the fuse units are connected in series to the electrical path of the conductive connector. In this way, the fuse unit can separately protect different electronic elements and different electrical paths in the embedded substrate.

In an optional implementation, fusible structures in different fuse units have different preset current thresholds. In this way, different fuse units can adapt to different electronic elements and safety current thresholds of different electrical paths.

In an optional implementation, fusible structures in different fuse units have at least one of the following different parameters: a melting point of the fusible structure, a usage amount of the fusible structure in the fuse unit, and the cross-sectional area of the fusible structure in the direction perpendicular to the electrical path.

In an optional implementation, the insulation layer includes a first side and a second side that are disposed opposite to each other, the external connection end is located on the first side of the insulation layer, and the fuse unit is located on the second side of the insulation layer. In this way, when the fusible structure in the fuse unit is blown, a spacing between a blown position and the circuit board is long, so that the circuit board is not damaged.

In an optional implementation, the insulation layer further includes a third insulation layer, the third insulation layer is located on one side that is of the first insulation layer and that faces away from the second insulation layer, and the third insulation layer has a hollow area. The external connection end is located on a surface that is of the first insulation layer and that faces the third insulation layer, and is exposed in the hollow area. In this way, the external connection end does not protrude from the entire surface of the embedded substrate, so that the embedded substrate can be conveniently and stably installed on the circuit board.

According to a second aspect, this application provides a circuit board assembly, including a circuit board and the foregoing embedded substrate. The embedded substrate is disposed on the circuit board, and an external connection end of the embedded substrate is electrically connected to the circuit board. In this way, if the embedded substrate is blown due to current overload, only the embedded substrate needs to be repaired or replaced, and another electronic component on the circuit board can still work normally. Therefore, maintenance and replacement costs are low, and a volume of the circuit board is compact.

In an optional implementation, the circuit board is a printed circuit board.

In an optional implementation, the embedded substrate is a power supply configured to supply power to the circuit board. In this way, because a large current may pass through the embedded substrate that is used as the power supply, a fuse unit disposed in the embedded substrate, so that when an excessively large current passes through a circuit of the circuit board assembly, the fuse unit is blown to protect the embedded substrate.

According to a third aspect, this application provides an electronic device, including the circuit board assembly described above. In this way, if the embedded substrate is blown due to current overload, only the embedded substrate needs to be repaired or replaced, and another electronic component on the circuit board can still work normally. Therefore, maintenance and replacement costs are low, and a volume of the circuit board is compact.

According to the embedded substrate, the circuit board assembly, and the electronic device provided in this application, the embedded substrate includes the insulation layer, the electronic element, and the conductive connector. The electronic element and the conductive connector are embedded inside the insulation layer, the conductive connector is electrically connected to the electronic element, and the conductive connector includes an external connection end for transmitting an electrical signal to the electronic element. The conductive connector includes at least one fuse unit, each of the at least one fuse unit includes a fusible structure and two electrical connection ends, the fusible structure is connected between the two electrical connection ends in a direction of an electrical path of the conductive connector, and the fusible structure is configured to be blown when a passing current exceeds a preset current threshold, to disconnect an electrical connection between the electronic element and the external connection end. In this way, if the embedded substrate is blown due to current overload, only the embedded substrate needs to be repaired or replaced, and another electronic component on the circuit board can still work normally. Therefore, maintenance and replacement costs are low, and a volume of the circuit board is compact.

REFERENCE NUMERALS

1: insulation layer; 2: electronic element; 3: conductive connector; 10 and 10a: embedded substrate; 20 and 20a: circuit board; 30 and 30a: electronic component; 40a: fuse tube; 21, 22, 23, 24, and 25: chip; 31: external connection end; 32, 32a, 32b, 32c, 32d, 32e, and 32f: fuse unit; 321: fusible structure; 322: electrical connection end; 323 and 326: roundabout channel; 324: first insulator; 325: second insulator; 121 and 131: hollow area; 11: first insulation layer; 12: second insulation layer; 13: third insulation layer; 321a: fusible conductive material; 321b: fusible part; 3211: nick; 3251: protruding part; and 100 and 100a: circuit board assembly.

DESCRIPTION OF EMBODIMENTS

An embedded substrate is an integrated electronic component packaging structure in which an electronic component is embedded in a substrate. In the embedded substrate, a cavity may be disposed inside the substrate, and the electronic component is disposed inside the cavity in a surface mounting manner: or the electronic component is embedded into the cavity in a lamination manner, and then an outer side of the electronic component is covered with the substrate. The electronic component inside the embedded substrate may be interconnected with a component outside the substrate by using a printed conducting wire inside the substrate. In this way, the embedded substrate has a simple appearance, and integration of internal electronic components is high.

Currently, the embedded substrate may be used with another electronic component. For example, the embedded substrate and the another electronic component are disposed on another circuit board, and the embedded substrate implements signal interconnection with the another electronic component on the circuit board by using a printed conducting wire of the circuit board. A circuit board configured to dispose and fasten the embedded substrate may be a printed circuit board (PCB).

Figure 1:
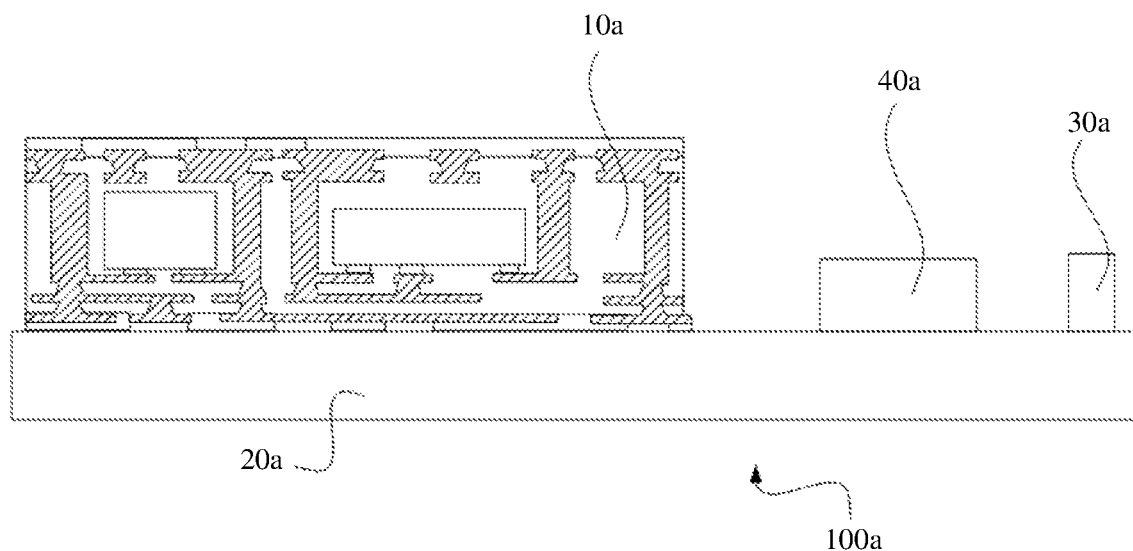
FIG. 1 is a schematic diagram of a structure of a conventional circuit board assembly.

To prevent an electronic component in the circuit board from being blown due to a case such as current overload, a fuse tube is usually disposed in the circuit board. FIG. 1 is a schematic diagram of a structure of a conventional circuit board assembly. As shown in FIG. 1, in the conventional circuit board assembly 100a, an embedded substrate 10a and another electronic component 30a are disposed on a circuit board 20a, and a fuse tube 40a is further disposed on the circuit board 20a. The fuse tube 40a, the embedded substrate 10a, and the another electronic component 30a are installed in parallel on the circuit board 20a, and the fuse tube 40a is connected in series in a circuit of the circuit board 20a. A resistance-type fuse is usually disposed in the fuse tube 40a. When a phenomenon such as current overload occurs in the circuit of the circuit board 20a, a fuse in the fuse tube 40a generates a high temperature under a large current. Therefore, the fuse tube 40a is blown. In this way, the fuse tube 40a disconnects connection of the circuit of the circuit board 20a because the fuse tube 40a is blown, to protect the circuit board 20a.

However, because a temperature is high when the fuse tube 40a on the circuit board 20a is blown, electronic components 30a around the fuse tube 40a may fail or even be blown due to of the high temperature. However, the electronic components 30a are usually welded on the circuit board 20a, and are difficult to disassemble and replace. Therefore, when the electronic components 30a are blown, the entire circuit board assembly 100a usually needs to be replaced, which results in high maintenance and replacement costs. In addition, the fuse tube 40a also occupies a large volume and large space on the circuit board 20a. This restricts further reduction of a size of the circuit board 20a and improvement of an integration level of the circuit board 20a.

Therefore, this application provides a new embedded substrate, a circuit board assembly, and an electronic device, to avoid a case in which an entire circuit board needs to be replaced when current overload occurs in the circuit board.

Figure 2:
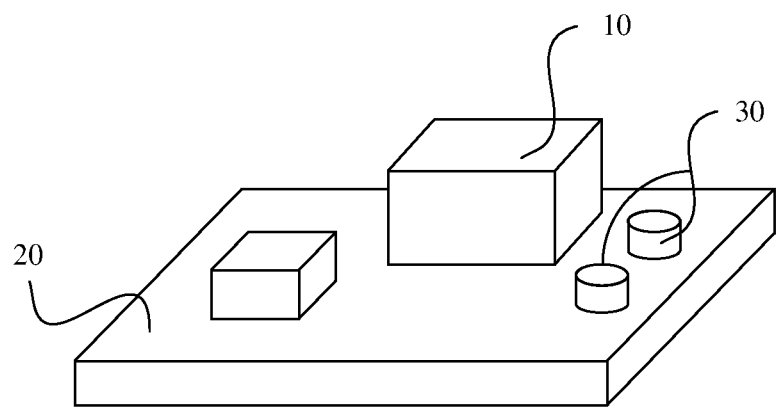
FIG. 2 is a schematic diagram of a structure of a circuit board assembly according to an embodiment of this application.
Figure 3:
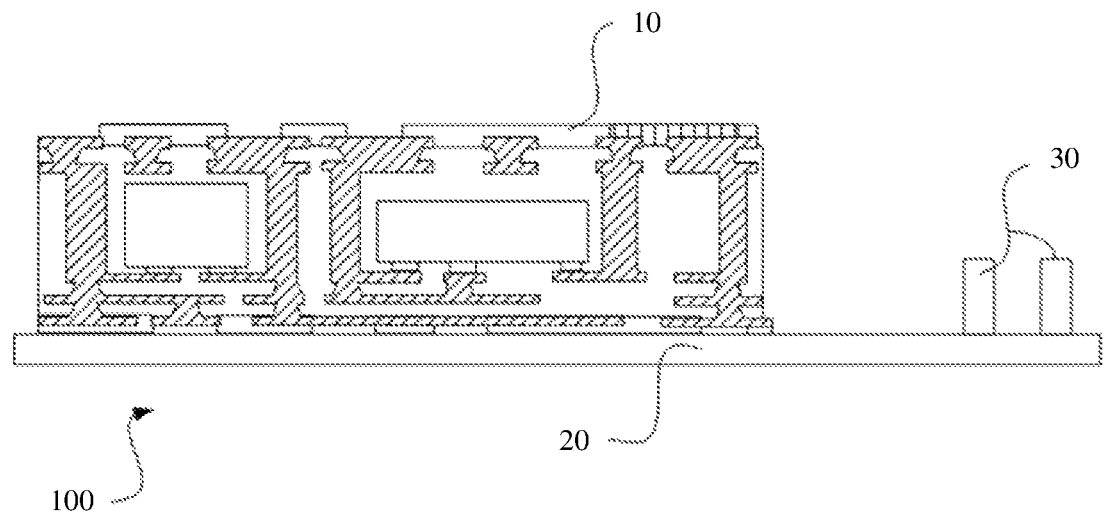
FIG. 3 is a cross-sectional schematic view of the circuit board assembly in FIG. 2.

FIG. 2 is a schematic diagram of a structure of a circuit board assembly according to an embodiment of this application. FIG. 3 is a cross-sectional schematic view of the circuit board assembly in FIG. 2. As shown in FIG. 2 and FIG. 3, an electronic device may have one or more circuit board assemblies 100. The circuit board assemblies 100 form different functional modules, and implement different functions and operations through interconnection inside the circuit board assembly 100 and interconnection between the circuit board assemblies 100. Specifically, the circuit board assembly 100 in this application may include the circuit board 20 and at least one embedded substrate 10. The embedded substrate 10 is disposed on the circuit board 20, and is electrically connected to the circuit board 20, to implement interconnection and signal transmission. The circuit board 20 configured to serve as a carrier of the embedded substrate 10 may be specifically a printed circuit board.

In addition, to implement a function of the circuit board assembly 100, the circuit board 20 may further have another electronic component 30. The another electronic component 30 disposed on the circuit board 20 may be an active electronic component, for example, a chip, a diode, or a transistor. Alternatively, the another electronic component 30 may be a passive electronic component, for example, a resistor, an inductor, or a capacitor. Alternatively, the another electronic component 30 may be a combination of the active electronic component and the passive electronic component, or the like.

In an optional manner in this embodiment, the embedded substrate 10 may be a power supply, and is configured to supply power to the circuit board assembly 100. In this way, a large current may pass through the embedded substrate 10 that is used as a power supply. When a current is large, the embedded substrate 10 and the electronic component in the entire circuit board assembly 100 may be damaged. Therefore, a fuse unit is disposed in the embedded substrate 10, so that when an excessively large current passes through the circuit of the circuit board assembly 100, the fuse unit is blown to protect the embedded substrate 10.

Figure 4:
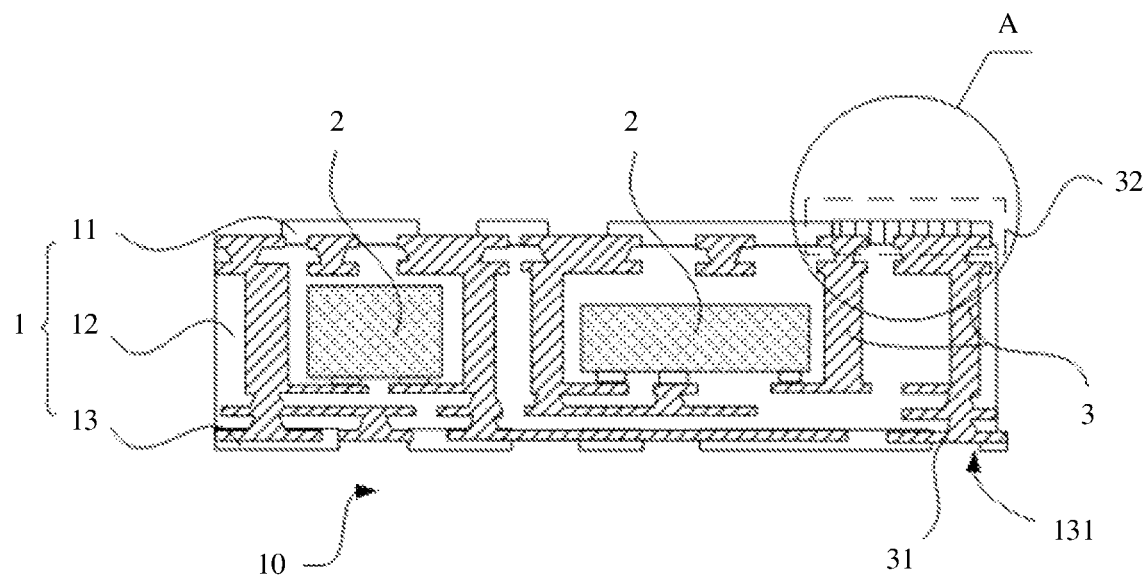
FIG. 4 is a schematic diagram of a structure of an embedded substrate according to an embodiment of this application.
Figure 5:
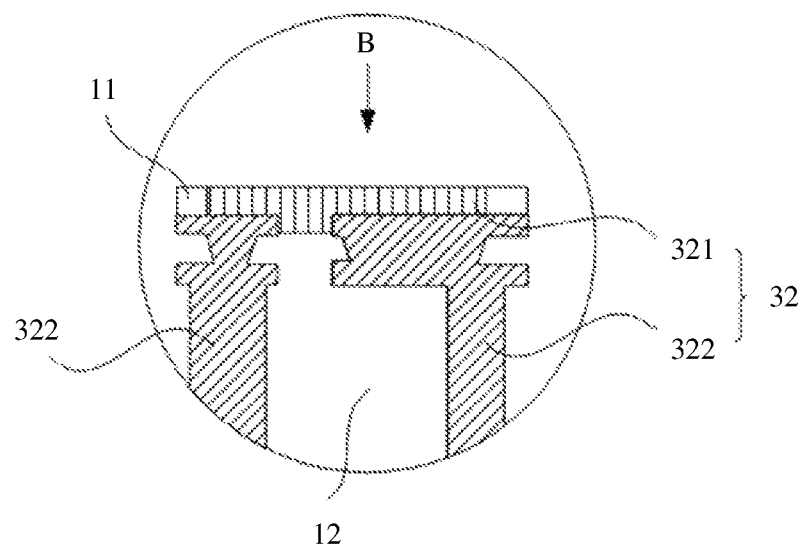
FIG. 5 is a partially enlarged schematic diagram of a position A in FIG. 4.

FIG. 4 is a schematic diagram of a structure of an embedded substrate according to an embodiment of this application. FIG. 5 is a partially enlarged schematic diagram of a position A in FIG. 4. As shown in FIG. 4 and FIG. 5, the embedded substrate 10 disposed in the circuit board assembly 100 may include components such as an insulation layer 1, an electronic element 2, and a conductive connector 3. The electronic element 2 and the conductive connector 3 are embedded inside the insulation layer 1, the conductive connector 3 is electrically connected to the electronic element 2, and the conductive connector 3 includes an external connection end 31 for transmitting an electrical signal to the electronic element 2. The conductive connector 3 includes at least one fuse unit 32, each of the at least one fuse unit 32 includes a fusible structure 321 and two electrical connection ends 322, the fusible structure 321 is connected between the two electrical connection ends 322 in a direction of an electrical path of the conductive connector 3, and the fusible structure 321 is configured to be blown when a current that passes through the fusible structure 321 exceeds a preset current threshold, to disconnect an electrical connection between the electronic element 2 and the external connection end 31.

The electronic element 2 in the embedded substrate 10 may be an active electronic component, for example, a chip, a diode, or a transistor. Alternatively, the electronic element 2 may be a passive electronic component, for example, a resistor, an inductor, or a capacitor. Alternatively, the electronic element 2 may be a combination of an active electronic component and a passive electronic component, or the like. In this embodiment, an example in which the electronic element 2 in the embedded substrate 10 is a chip is used for description.

One or more cavities may be disposed in the insulation layer 1 of the embedded substrate 10. The electronic element 2 and the conductive connector 3 may be disposed in the cavity in a surface mounting or lamination manner, and a material of the insulation layer 1 is used to cover surfaces of the electronic element 2 and the conductive connector 3. In this way, the electronic element 2 and the conductive connector 3 may be packaged inside the embedded substrate 10. However, under isolation and blocking of the insulation layer 1, the electronic element 2 can be conducted with a circuit outside the embedded substrate 10 only by using the conductive connector 3. Therefore, insulation protection for the electronic element 2 is implemented.

A material forming the insulation layer 1 may be epoxy resin, phenolic resin, another insulation material well known by a person skilled in the art, or the like, which is not limited in this embodiment.

To connect the electronic element 2 to the circuit outside the embedded substrate 10, the conductive connector may be interconnected and conducted with the electronic element 2, and the conductive connector has an external connection end that can be connected to another circuit outside the embedded substrate 10. In this way, the conductive connector establishes one or more electrical paths between the electronic element 2 and the circuit outside the embedded substrate 10, and the electronic element 2 may be interconnected with the circuit outside the embedded substrate 10 by using the electrical paths, to transmit an electrical signal.

It may be learned from the foregoing that, connection and signal conduction between the electronic element 2 in the embedded substrate 10 and the circuit outside the embedded substrate 10 mainly depend on the electrical paths provided by the conductive connector 3. Therefore, a fuse unit 32 may be disposed on the conductive connector 3, and the fuse unit 32 may disconnect a circuit when an excessively large current passes through the conductive connector 3. In this way, when a current overload phenomenon occurs in the electrical path of the conductive connector 3, a connection between the electronic element 2 and the circuit outside the embedded substrate 10 may be disconnected by using a protection function of the fuse unit 32, to protect the embedded substrate 10 and a circuit in the entire circuit board assembly.

In this way, the fuse unit 32 is disposed on the embedded substrate 10, and when an excessive large current passes through the fuse unit, the fuse unit 32 is blown to protect the circuit. Because a blown position is located on the embedded substrate 10, only the embedded substrate 10 may be affected by a high temperature generated when the fuse unit 32 is blown, and another electronic component in the circuit board assembly 100 is not damaged due to the high temperature generated when the fuse unit 32 is blown. In this way, if the embedded substrate 10 is blown due to current overload, only the embedded substrate 10 needs to be repaired or replaced, and another electronic component on the circuit board 20 can still work normally. Therefore, maintenance and replacement costs are low. In addition, because the fuse unit 32 is integrated on the embedded substrate 10, no extra space of the circuit board 20 is occupied, and a volume of the circuit board is compact.

It may be understood that, because more than one chip may be disposed inside the embedded substrate 10, and the chips may require safe currents of different magnitudes, correspondingly, an electrical path of the embedded substrate 10 may include one or more fuse units 32. In this way, different fuse units are blown to protect different chips.

Specifically, each fuse unit 32 includes the fusible structure 321 and the two electrical connection ends 322. The two electrical connection ends 322 are sequentially disposed in the direction of the electrical path. The fusible structure 321 is located between the two electrical connection ends 322, and the fusible structure 321 is a conductor, so that the two electrical connection ends 322 can be conducted with each other. When a current passes through an electrical path of the embedded substrate 10, a conductor in the electrical path generates specific heat due to resistance of the conductor. When an excessively large current passes through the electrical path, heat generated by the conductor is also large. When the current passing through the electrical path of the embedded substrate 10 exceeds a preset threshold, the fusible structure 321 is blown earlier than another part of the conductive connector 3, so that the circuit is disconnected promptly, to protect the embedded substrate 10 and the entire circuit board assembly 100.

To enable the fusible structure 321 to be blown earlier than the another part of the electrical path of the embedded substrate 10, the fusible structure 321 may have larger resistance than resistance of the another part of the conductive connector 3. Therefore, the fusible structure 321 is blown because more heat is generated, or the fusible structure 321 is blown because the fusible structure 321 has a lower melting point than a melting point of the conductive connector 3.

Optionally, the conductive connector 3 may be made of a metal material with low resistivity, for example, copper. Correspondingly, a main material forming the fusible structure 321 may be a metal material whose melting point is lower than a melting point of copper.

Correspondingly, the fusible structure 321 may have a plurality of different types and structures, and the fusible structure 321 may also have different disposing manners and disposing positions.

In an optional implementation, to facilitate disposing of the fusible structure 321 on the embedded substrate 10, and facilitate repair and reconnection after the fusible structure 321 is blown, the fusible structure 321 may be exposed on an outer surface of the insulation layer 1.

In this case, the fusible structure 321 is exposed, and covers a part of a surface layer area of the embedded substrate 10. In this way, the fusible structure 321 may be directly disposed on the outer surface of the insulation layer 1 through printing, etching, or the like. Therefore, processing and manufacturing are convenient. In addition, even if the fusible structure 321 is blown, a blown position is also located on the surface layer of the embedded substrate 10, to facilitate cleaning or repairing of the blown position.

It may be understood that, to prevent the fusible structure 321 from affecting an overall appearance of the embedded substrate 10, in an optional implementation, a part in which the fusible structure 321 is located may be lower than an overall outer surface of the embedded substrate 10, or may be flush with the outer surface of the embedded substrate 10. In this way, the fusible structure 321 does not protrude from an outermost surface of the embedded substrate 10. In other words, the fusible structure 321 does not affect an overall shape and a size of the embedded substrate 10.

In addition, in the embedded substrate 10, the insulation layer 1 may be a multi-layer structure. Correspondingly, the fusible structure 321 and another structure of the conductive connector 3 may be located at different layers. Structures of different layers may be formed by using different materials.

For example, the insulation layer located on the surface of the embedded substrate 10 and the insulation layer located inside the embedded substrate 10 may be made of different materials.

Figure 6:
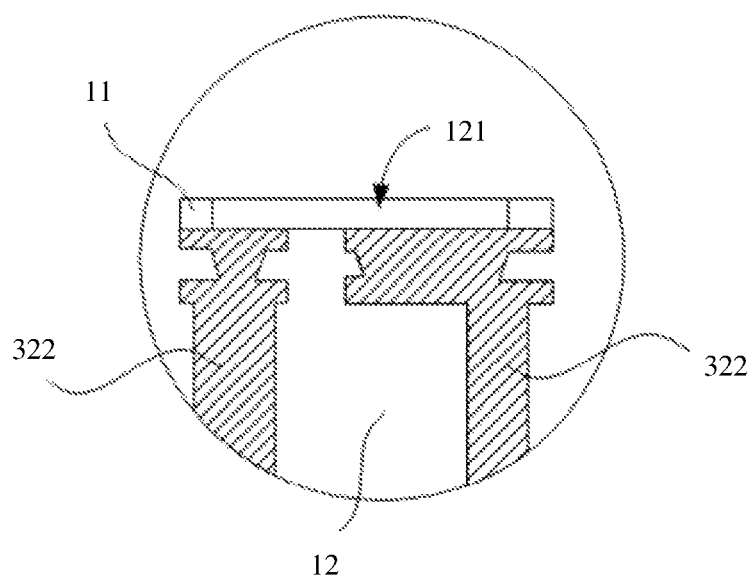
FIG. 6 is a schematic diagram of a structure of the position A in FIG. 4 when no fusible structure is disposed in a fuse unit in FIG. 5.

FIG. 6 is a schematic diagram of a structure of a position A in FIG. 4 when no fusible structure is disposed in a fuse unit in FIG. 5. As shown in FIG. 4 and FIG. 6, in an optional embedded substrate structure, the insulation layer 1 includes a first insulation layer 11 and a second insulation layer 12 that are disposed in a stacked manner, and the second insulation layer 12 has a hollow area 121. Specifically, the hollow area 121 penetrates the entire second insulation layer 12 and reaches the first insulation layer 11. In this case, a bottom of the hollow area 121 is a boundary area between the first insulation layer 11 and the second insulation layer 12. In this way, the electronic element 2 and the conductive connector 3 may be embedded in the first insulation layer 11, the fuse unit 32 is located on a surface that is of the first insulation layer 11 and that faces the second insulation layer 12, and the fuse unit 32 is exposed in the hollow area 121. Details are shown in FIG. 4.

In this case, the first insulation layer 11 and the second insulation layer 12 may be formed by using different materials, and formed by using different processes. Therefore, when the embedded substrate 10 is manufactured, the electronic element 2 and the conductive connector 3 may be first embedded in the first insulation layer 11, and then the second insulation layer 12 and the fuse unit 32 are disposed on a surface of the first insulation layer 11. In this way, the fuse unit 32 and the electronic element 2 are separately disposed in different processes. Disposing of the fuse unit 32 is convenient, and has small impact on an overall structure of the embedded substrate 10.

Optionally, the fusible structure 321 may fill or occupy a part of the hollow area 121, or may occupy an entire range of the hollow area 121. A filling area or a filling proportion of the fusible structure 321 in the hollow area 121 may be correspondingly determined based on a specific form of the fusible structure and a performance requirement of the fuse unit 32. In this way, a filling range of the fusible structure 321 in the hollow area 121 may be adjusted, to correspondingly control a usage amount of the fusible structure 321.

When the fuse unit 32 in the embedded substrate 10 is blown to protect the embedded substrate 10, the fusible structure 321 may generate a large amount of heat. If the fusible structure 321 is close to the circuit board 20 on which the embedded substrate 10 is located, the circuit board 20 may be damaged due to a high temperature generated when the fusible structure 321 is blown. To prevent the fusible structure from burning the circuit board, in an optional manner, in the embedded substrate 10, the insulation layer 1 includes a first side and a second side that are disposed opposite to each other, the external connection end 31 of the conductive connector 3 is located on the first side of the insulation layer 1, and the fuse unit 32 is located on the second side of the insulation layer 1. In this case, the external connection end 31 may be far away from the fuse unit 32.

Figure 7:
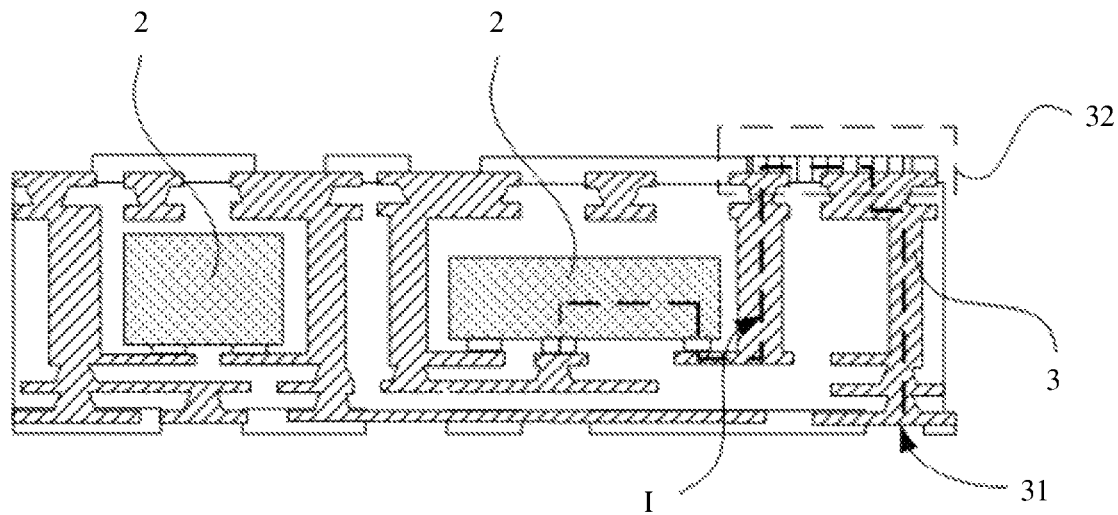
FIG. 7 is a schematic diagram of a direction of an electrical path in an embedded substrate according to an embodiment of this application.

Specifically, because the external connection end 31 of the conductive connector 3 is directly connected to the circuit board 20, the first side of the embedded substrate 10 faces the circuit board 20, and is connected and fastened to the circuit board 20, and the fuse unit 32 is located on a side that is of the embedded substrate 10 and that faces away from the circuit board 20. In this case, the fuse unit 32 is far away from the circuit board 20. FIG. 7 is a schematic diagram of a direction of an electrical path in an embedded substrate according to an embodiment of this application. As shown in FIG. 7, the fuse unit 32 is disposed on a side that is of the embedded substrate 10 and that is far away from the circuit board 20. In the embedded substrate 10, an electrical path I formed by the conductive connector 3 has a "wound-upwards" structure. In other words, after the electrical path is connected from the circuit board 20 to the external connection end 31, the electrical path I leads to the side that is of the embedded substrate 10 and that faces away from the circuit board 20, and is connected to the fuse unit 32 that is also located on the side that is of the embedded substrate 10 and that faces away from the circuit board 20. When the fusible structure 321 in the fuse unit 32 is blown, a spacing between a blown position and the circuit board 20 is long, so that the circuit board 20 is not damaged.

Because the external connection end 31 of the conductive connector 3 is disposed to face the circuit board 20, the embedded substrate 10 also has a corresponding connection structure, so that the external connection end 31 is connected to the circuit board 20. Optionally, in an optional structure, the insulation layer 1 further includes a third insulation layer 13, the third insulation layer 13 is located on a side that is of the first insulation layer 11 and that faces away from the second insulation layer 12, and the third insulation layer 13 includes the hollow area 131. The external connection end 31 is located on a surface that is of the first insulation layer 11 and that faces the third insulation layer 13, and is exposed in the hollow area 131.

In this case, a structure of the third insulation layer 13 is similar to a structure of the first insulation layer 11, and both of the third insulation layer 13 and the first insulation layer 11 are located on a surface layer of the embedded substrate 10. The hollow area 131 is disposed in the third insulation layer 13, and a bottom of the hollow area 131 is a boundary area between the third insulation layer 13 and the first insulation layer 11. Because there is the hollow area 131, the external connection end 31 of the conductive connector 3 embedded in the first insulation layer 11 may be exposed on a surface of the first insulation layer 11, and exposed in the hollow area 131. The hollow area 131 is disposed in the third insulation layer 13, and the external connection end 31 is disposed in the hollow area 131, so that the external connection end 31 does not protrude from an entire surface of the embedded substrate 10. In this way, the embedded substrate 10 can be conveniently and stably installed on the circuit board 20.

In addition, an overall structure of the embedded substrate 10 may be another possible form or structure. Details are not described herein.

The fusible structure 321 may have a plurality of different forms and structures, so that the fusible structure can be blown for protection when a large current passes through the fusible structure 321. For example, the fusible structure 321 may be made of a material with a low melting point. In this way, when a large current passes through the fusible structure 321, the fusible structure 321 may be blown because of heat generated by resistance of the fusible structure 321. In another implementation form, the fusible structure 321 and another part of the conductive connector 3 may be formed by using a same material, but the fusible structure 321 may be configured to have a small cross-sectional area, so that the fusible structure 321 forms large resistance, and when a large current passes through the fusible structure 321, the fusible structure 321 is blown due to heat energy generated by the resistance of the fusible structure 321. The following describes in detail various possible implementations of the fusible structure 321 and a related structure of the embedded substrate 10.

Figure 8:
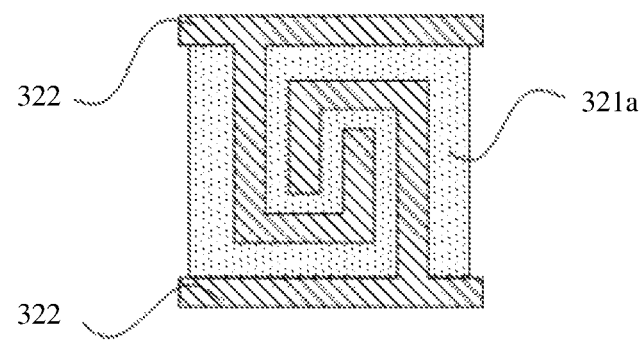
FIG. 8 is a possible schematic diagram of a structure of the fuse unit in FIG. 5 in a direction B.

FIG. 8 is a possible schematic diagram of a structure of the fuse unit in FIG. 5 in a direction B. As shown in FIG. 8, in an optional implementation of the fusible structure 321, the fusible structure 321 may be a fusible conductive material 321a, the two electrical connection ends 322 are spaced apart in the direction of the electrical path of the conductive connector 3, and the fusible structure 321 is connected between the two electrical connection ends 322.

In this case, the fusible conductive material 321a that forms the fusible structure 321 and the conductive connector 3 may be made of different materials. In this way, when the fusible structure 321 is disposed, the electrical connection ends 322 and the fusible conductive material 321a may be of a separated structure, and are formed by using a process. In such a disposing manner, the electrical connection ends of the conductive connector 3 impose few limitations on a material and a structure form of the fusible conductive material 321a, and the fusible conductive material 321a is in a free form.

The fusible conductive material 321a may be made of a material that can conduct electricity and has a low melting point, so that the electrical path of the conductive connector 3 may be conducted or the fusible conductive material 321a may be blown in the electrical path of the conductive connector 3. In addition, the fusible conductive material 321a may be made of a material that is easy to form, so that the fusible conductive material 321a can be disposed between the two electrical connection ends "322'n a preset shape or structure.

To dispose the fusible conductive material 321a between the two electrical connection ends 322, optionally, an accommodating space that can accommodate the fusible conductive material 321a may be formed between the two electrical connection ends 322 in the fuse unit, and the fusible conductive material 321a is disposed in the accommodating space. The two electrical connection ends may be spaced apart from each other, and a spaced area between the two electrical connection ends 322 may be used as the accommodating space for accommodating the fusible conductive material 321a. A shape and a size of the accommodating space may be determined based on shapes and relative positions of the two electrical connection ends 322 in the fuse unit, or may be determined based on another structure in the fuse unit. In this way, the accommodating space is formed between the electrical connection ends 322, and the fusible conductive material 321a may be disposed in the accommodating space. In addition, the fusible conductive material 321a works reliably, and does not easily interfere with or touch another part of the conductive connector 3.

In an optional manner, the two electrical connection ends 322 in the fuse unit may jointly define the accommodating space, which is specifically shown in FIG. 8. In this case, a shape and a size of the accommodating space may be defined only based on relative positions, a spacing between the two electrical connection ends 322, and a shape jointly enclosed by the two electrical connection ends 322, and the fusible conductive material 321a is disposed in the accommodating space.

It may be understood that the electrical connection ends 322 may be of a structure such as a side wall with a specific extension length or a "fence". Structures of the two electrical connection ends 322 may cooperate with each other, to jointly form a semi-closed pattern or structure. The fusible conductive material 321a may be blocked by the side wall of the electrical connection ends 322. In this way, the fusible conductive material 321a may be limited in the semi-closed pattern enclosed by the two electrical connection ends 322. In this way, the fusible conductive material 321a may have a specific shape and size by using different extension lengths and extension directions of the electrical connection ends 322.

Figure 9:
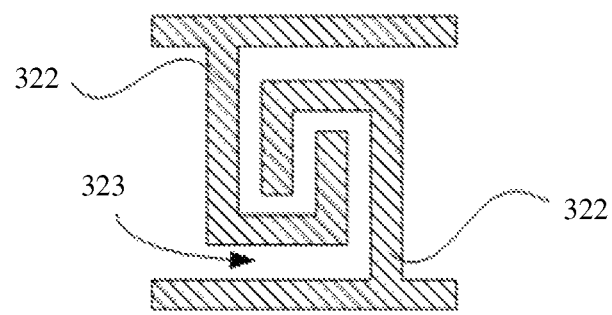
FIG. 9 is a schematic diagram of a structure of the fuse unit in FIG. 8 when no fusible conductive material is disposed.

In this way, the fusible conductive material 321a forms different shapes based on a shape of the accommodating space. FIG. 9 is a schematic diagram of a structure of the fuse unit in FIG. 8 when no fusible conductive material is disposed. As shown in FIG. 9, in an optional structure, the two electrical connection ends 322 may be bent and wound around each other, so that the accommodating space enclosed by the electrical connection ends 322 is in a shape of a roundabout channel 323. The roundabout channel 323 may be filled with the fusible conductive material 321a, as shown in FIG. 8. In this case, the roundabout channel 323 has two opposite side walls wound around each other, and the two side walls are respectively formed by the two electrical connection ends 322. The fusible conductive material 321a located between the two opposite side walls of the roundabout channel 323 conducts the two opposite electrical connection ends 322 under electricity conduction of the fusible conductive material 321a, and when a large current passes through the fusible conductive material 321a, the fusible conductive material 321a is blown to disconnect an electrical connection between the two opposite side walls of the roundabout channel 323. Because the accommodating space is in a shape of the roundabout channel 323, the fusible conductive material 321a is correspondingly in a roundabout structure. In this way, when the accommodating space occupies small space, a large contact area is provided between the fusible conductive material 321a and the electrical connection ends 322. Therefore, it can be ensured that the fuse unit 32 forms a normal and reliable electrical path in a normal working state. In addition, when the accommodating space is in the shape of the roundabout channel 323, the roundabout channel 323 should be a single channel. This avoids that a redundant path is formed between the fusible conductive material 321a and the electrical connection end 322, the redundant path prevents a normal electrical path in the embedded substrate 10 from working, or when a large current passes through the fusible conductive material 321a, a protection function of the fuse unit 32 is affected because the fusible conductive material 321a is not successfully blown.

In this case, to enable the two electrical connection ends 322 to jointly enclose the roundabout channel 323, the two electrical connection ends 322 may be located at similar heights or a same height in the embedded substrate 10. For example, the two electrical connection ends 322 in the fuse unit may be located at the same height. In other words, the two electrical connection ends 322 are located at a same layer. In this case, both of the roundabout channel 323 and the fusible conductive material 321a disposed in the roundabout channel 323 are of planar layer structures extending in a surface direction of the embedded substrate 10. In this embodiment, an example in which the two electrical connection ends 322 in the fuse unit are located at a same height and the roundabout channel is of a planar layer structure is used for description.

In addition, it may be understood that, in another implementation, the two electrical connection ends 322 may be located at different heights in the embedded substrate 10. In this case, the two electrical connection ends 322 may jointly enclose a roundabout channel with a three-dimensional shape, or the two electrical connection ends 322 respectively form two opposite side walls of the roundabout channel in a thickness direction of the embedded substrate 10. Herein, when the electrical connection ends 322 are located at different heights, a specific shape of the roundabout channel is not described in detail.

Specifically, the two electrical connection ends 322 of the fuse unit may be located on a topmost layer of the embedded substrate 10. In this way, the fusible conductive material 321a connected between the two electrical connection ends 322 may be located on a surface of the embedded substrate 10. Therefore, disposing, maintenance, and replacement of the fusible conductive material 321a are facilitated.

The roundabout channel 323 formed by the accommodating space may have a plurality of different specific forms. For example, as shown in FIG. 9, the roundabout channel may be similar to a "hollow-out" shape. In other words, the two electrical connection ends 322 in the fuse unit are bent in a symmetrical direction or an opposite direction and wound around each other, and the two electrical connection ends 322 are always spaced apart from each other, so that the roundabout channel in the "hollow-out" shape is formed between the two electrical connection ends 322.

Alternatively, the roundabout channel may be in a shape of a maze. In this case, the two electrical connection ends 322 are disposed in parallel and are spaced apart from each other, and extend in a unified direction at the same time. As an extension direction of the electrical connection ends 322 changes, the entire roundabout channel in the accommodating space is in a shape similar to a maze.

In addition, the roundabout channel may also be in another different form, and a specific shape of the roundabout channel is not limited in this embodiment.

The fusible conductive material 321a may fill a part of space of the roundabout channel 323. Alternatively, the fusible conductive material 321a may fill the entire roundabout channel 323. Alternatively, the fusible conductive material 321a may fill the space inside and outside the roundabout channel 323. As filling amounts and filling forms are different, usage amounts of the fusible conductive material 321a disposed between the two electrical connection ends 322 can be different, so that currents fusing the fusible conductive material 321a are also of different magnitudes. In FIG. 8, the fusible conductive material 321a fills the space inside and outside the roundabout channel 323.

In addition, because the fusible conductive material 321a may have a deformation characteristic, for example, a melting or flowing phenomenon occurs in a partial structure of the fusible conductive material 321a at a high temperature. In this way, after the fusible conductive material 321a is blown, the fusible conductive material 321a may still be re-contacted and conducted at a blown position due to deformation or backflow of the fusible conductive material 321a. To avoid a reconnection phenomenon after the fusible conductive material 321a is blown, partition structures may be disposed at some specific positions of the fusible conductive material 321a, and the partition structures are used to prevent backflow of the fusible conductive material 321a after the fusible conductive material 321a is blown. The specific positions may be considered as partition points of the fusible conductive material 321a. In this way, after the fusible conductive material 321a is blown, the fusible conductive material 321a is blocked by the partition structures, and is not reconnected. Therefore, the fusible conductive material 321a has high reliability. In addition, because the partition structures are disposed at the specific positions, cross-sectional areas of the partition structures in the electrical path may also be small. When a large current passes through the partition structures, the partition structures may first be blown. In this way, a specific position at which the fusible conductive material 321a is blown is further disposed by disposing the partition point.

Figure 10:
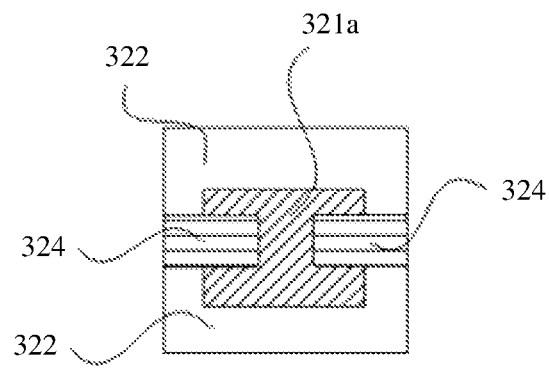
FIG. 10 is a schematic diagram of a structure of a fusible position of a fusible conductive material in a first accommodating space according to an embodiment of this application.
Figure 11:
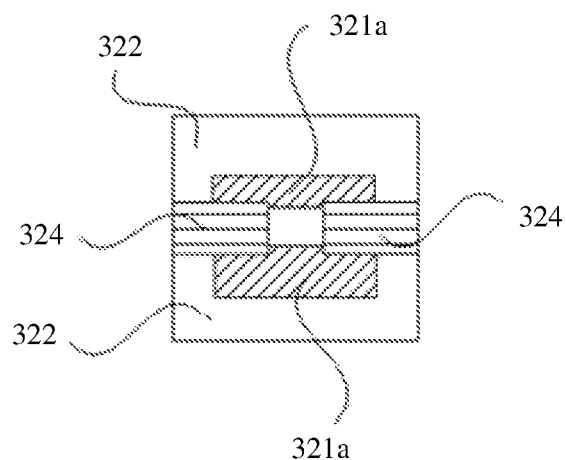
FIG. 11 is a schematic diagram of a structure of a fusible position obtained after the fusible conductive material in FIG. 10 is blown.

FIG. 10 is a schematic diagram of a structure of a fusible position of a fusible conductive material in a first accommodating space according to an embodiment of this application. FIG. 11 is a schematic diagram of a structure of a fusible position obtained after the fusible conductive material in FIG. 10 is blown. As shown in FIG. 10 and FIG. 11, to form a partition point of the fusible conductive material 321a, two spaced first insulators 324 are disposed between the two electrical connection ends 322, and a spacing between the two first insulators 324 is less than a width of a remaining part of the fusible conductive material 321a in the direction of the electrical path, so that a part that is of the fusible conductive material 321a and that is located between the two first insulators 324 forms a partition point.

Specifically, because there is a small spacing between the two first insulators 324 that are disposed opposite to each other, correspondingly, a cross-sectional area of the part that is of the fusible conductive material 321a and that is located between the two first insulators 324 is small, and a resistance value is large. After the fusible electric conductor material 321a is blown, the fusible conductive material 321a may be disconnected from positions corresponding to the two first insulators 324. In this case, the fusible conductive material 321a is divided, at the blown positions, into a first part connected to one of the electrical connection ends 322 and a second part connected to the other electrical connection end 322, and a gap is generated between the first part and the second part because the fusible conductive material 321a is blown. A temperature of the fusible conductive material 321a decreases after the fusible conductive material 321a is blown, and the fusible conductive material 321a is restored to a solid state. In this case, due to surface tension, the first part and the second part tend to retract to the electrical connection ends 322 that respectively corresponds to the first part and the second part. Due to retraction, a spacing between the first part and the second part increases, and the residual fusible conductive material 321a between the first part and the second part is pulled away by the first part or the second part, to maintain a disconnected state between the first part and the second part, and prevent the first part and the second part from re-approaching to each other and contacting with each other in a fused state. In addition, in a process in which the fusible conductive material 321a is restored to the solid state, the fusible conductive material 321a does not remain on the surface of the insulation layer, so that a micro short circuit does not occur. A spacing between the two first insulators 324 may be correspondingly set based on different materials of the fusible conductive material 321a and different blown-out currents.

Figure 12:
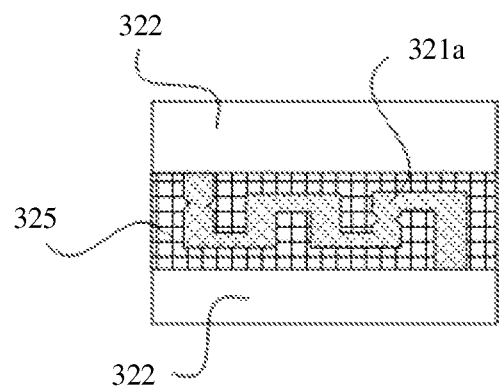
FIG. 12 is another schematic diagram of a structure of the fuse unit in FIG. 5.

FIG. 12 is another schematic diagram of a structure of the fuse unit in FIG. 5. In addition to the foregoing manner in which the two electrical connection ends 322 directly define the shape of the accommodating space, in another optional implementation, the two electrical connection ends 322 in the fuse unit are disposed opposite to each other. The fuse unit further includes a second insulator 325, the second insulator 325 is provided with the accommodating space, and the accommodating space is connected to the two electrical connection ends 322.

In this case, the accommodating space is not directly enclosed by the electrical connection ends 322, but is formed by the second insulator 325 disposed between the two electrical connection ends 322. Correspondingly, the fusible conductive material 321a accommodated in the accommodating space is also located inside the second insulator. To maintain a connection between the fusible conductive material 321a and the two electrical connection ends 322, the accommodating space in the second insulator is connected to the two electrical connection ends 322 in the fuse unit. In this way, the entire accommodating space may have a shape and structure similar to a shape and structure of a channel. The fusible conductive material 321a is disposed in the channel and has a shape that matches or is consistent with the channel.

Because the channel and the two electrical connection ends 322 in the fuse unit 32 maintain in communication, correspondingly, a shape formed by the fusible conductive material 321a also contacts the electrical connection ends 322, so that the two electrical connection ends 322 are conducted by using the fusible conductive material 321a. When the fusible conductive material 321a is blown in a case in which an excessively large current passes through the fusible conductive material 321a, an electrical path between the two electrical connection ends 322 is also disconnected, to protect the embedded substrate 10 and a circuit of the entire circuit board.

Specifically, the second insulator 325 and the insulation layer 1 of the embedded substrate 10 may be of an integrated structure, or may be of a separated structure. In this embodiment, an example in which the second insulator 325 and the insulation layer 1 are of a separated structure independent of each other is used for description.

The two electrical connection ends 322 in the fuse unit may be located at a same height or similar heights on the embedded substrate 10, or may be located at different layers or different heights on the embedded substrate 10. Correspondingly, as heights of the two electrical connection ends 322 are the same or different, the second insulator 325 may also be correspondingly of a planar layer structure or a three-dimensional structure. In this embodiment, an example in which the two electrical connection ends 322 in the fuse unit are located at a same height or similar heights on the embedded substrate 10 and the second insulator 325 is of a planar layer structure is used for description.

Specifically, the two electrical connection ends 322 in the fuse unit are disposed opposite to each other, and there is a spacing sufficient to accommodate the second insulator between the two electrical connection ends 322. Because a structure used to accommodate the fusible conductive material 321a is formed by the second insulator 325, the electrical connection ends 322 may have a simple and regular shape and structure. For example, edge shapes of the two electrical connection ends 322 that are disposed opposite to each other may be parallel to each other. In this way, a uniform spacing is formed between the electrical connection ends 322, to avoid a case in which the two electrical connection ends 322 are in direct contact and conducted due to irregular shapes of the electrical connection ends 322.

Figure 13:
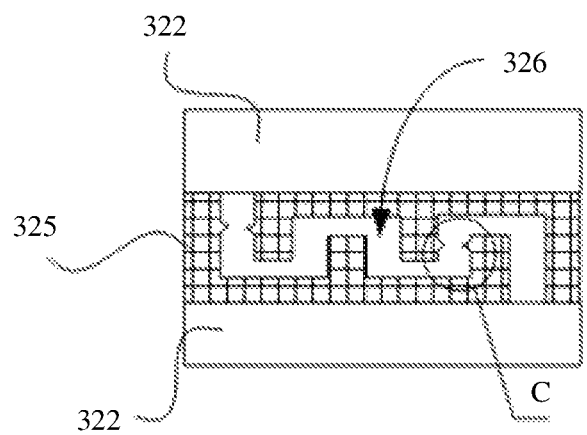
FIG. 13 is a schematic diagram of a structure of the fuse unit in FIG. 12 when no fusible conductive material is disposed.

FIG. 13 is a schematic diagram of a structure of the fuse unit in FIG. 12 when no fusible conductive material is disposed. As shown in FIG. 13, in this case, similar to a case in which the electrical connection ends 322 directly enclose the accommodating space, when the accommodating space is formed inside the second insulator 325, the accommodating space may also be a tortuous roundabout channel 326. Different from a structure of the roundabout channel when the electrical connection ends 322 directly enclose the accommodating space, in this case, both of side walls on two opposite sides of the roundabout channel 326 are formed by the second insulator 325, and the fusible conductive material 321a fills all space of the roundabout channel 326, to separately contact the two electrical connection ends 322 at two ends of the roundabout channel 326. When the embedded substrate 10 works normally, the fusible conductive material 321a conducts, under electricity conduction of the fusible conductive material 321a, the two opposite electrical connection ends 322, and when an excessively large current passes through the fusible conductive material 321a, the fusible conductive material 321a is blown, to disconnect an electrical connection between the two ends of the roundabout channel 326. In this way, because the fusible conductive material 321a has a roundabout shape corresponding to a shape of the roundabout channel 326, when a space occupied by the accommodating space is small, a large contact area is provided between the fusible conductive material 321a and the electrical connection ends 322. Therefore, it can be ensured that the fuse unit 32 forms a normal and reliable electrical path in a normal working state.

Specifically, when the accommodating space is the roundabout channel 326 disposed inside the second insulator 325, the roundabout channel 326 formed by the accommodating space may also have a plurality of different specific forms. For example, as shown in FIG. 13, the roundabout channel 326 inside the second insulator 325 may be similar to a shape of a maze, may be in a "hollow-out" shape, or may be in another different form and shape.

Figure 14:
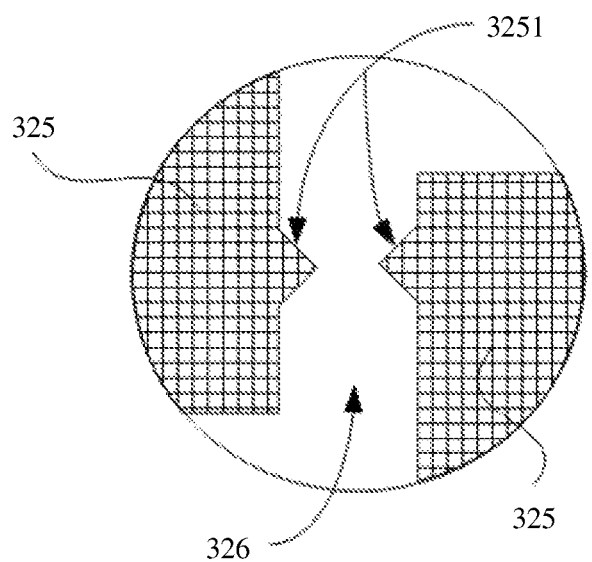
FIG. 14 is a partially enlarged schematic diagram of a position C in FIG. 13.

When the second insulator 325 is used in the fuse unit 32 to form the accommodating space for accommodating the fusible conductive material 321a, a fusible position of the fusible conductive material 321a may also be formed. FIG. 14 is a partially enlarged schematic diagram of a position C in FIG. 13. As shown in FIG. 13 and FIG. 14, in an optional implementation, the second insulator 325 has a protruding part 3251 protruding into the accommodating space, so that the fusible conductive material 321a forms a partition point at a position corresponding to the protruding part 3251.

Specifically, the accommodating space in the second insulator 325 may be in a shape of a channel. For example, as shown in FIG. 13, the roundabout channel 326 is formed in the second insulator 325, and widths and cross-sectional areas of segments of the roundabout channel 326 are basically equal. To avoid a reconnection phenomenon after the fusible conductive material 321a is blown, the second insulator 325 may include the protruding part 3251, and the protruding part 3251 is located in the accommodating space. In other words, the protruding part 3251 is located at an edge of the roundabout channel 326. Therefore, a width and a cross-sectional area of the accommodating space at a position corresponding to the protruding part 3251 suddenly decrease, to form a partition point. In this way, after the fusible conductive material 321a is blown, the fusible conductive material 321a is partitioned into two parts by the protruding part 3251. The two parts also retract due to thermal expansion and contraction characteristics and surface tension, and the residual fusible conductive material 321a on one side of the protruding part 3251 is pulled away, so that the fusible conductive material 321a remains in a partitioned state, and the fuse unit 32 has a reliable protection function. A spacing between the two protruding parts 3251 may be correspondingly set based on different materials of the fusible conductive material 321a and different blown-out currents.

The protruding part 3251 of the second insulator 325 may have a plurality of different shapes and forms. As shown in FIG. 14, in an optional second insulator structure, the protruding parts 3251 may be disposed on two opposite sides of the accommodating space of the second insulator 325, and a partition point of the fusible conductive material 321*a* is formed between the two protruding parts 3251. Alternatively, in another optional second insulator structure, the protruding part 3251 is disposed only on one side of the accommodating space of the second insulator 325, and the protruding part 3251 and the other side wall of the accommodating space jointly form a partition point of the fusible conductive material 321*a*. In this embodiment, an example in which the protruding parts 3251 are disposed on two opposite sides of the accommodating space of the second insulator 325 is used for description.

To improve working reliability of the fuse unit 32, there may be a plurality of partition points of the fusible conductive material 321*a* in the accommodating space, as shown in FIG. 13. In this way, after the fusible conductive material 321*a* is blown, the plurality of partition points may separately partition a part of the fusible conductive material 321*a* after the fusible conductive material 321*a* is blown, to avoid a case in which the fusible conductive material 321*a* maintains a connected state because a single partition point fails.

Optionally, the fusible conductive material 321*a* may be made of a plurality of different materials or in a plurality of forms. In an optional manner, the fusible conductive material 321*a* may be a colloidal object including a metal particle, and a melting point of the metal particle is lower than a melting point of the conductive connector 3.

In this case, the fusible conductive material 321*a* is the colloidal object. Therefore, the fusible conductive material 321*a* can be flexibly and conveniently disposed between the two electrical connection ends 322 in the fuse unit. For example, the fusible conductive material 321*a* may be disposed in the accommodating space of the fuse unit in a laying or filling manner. The fusible conductive material 321*a* includes a metal particle, and the metal particle is electrically conductive, so that the fusible conductive material 321*a* can conduct the two electrical connection ends 322. A melting point of the metal particle is lower than a melting point of a material that forms the conductive connector 3. Therefore, when a large current passes through an electrical path in the embedded substrate 10, the fusible conductive material 321*a* is blown earlier than another part of the conductive connector 3, to disconnect a circuit of the embedded substrate 10. Therefore, the embedded substrate 10 and the entire circuit board are protected.

The metal particle included in the fusible conductive material 321*a* may be made of metal materials with a low melting point such as tin. The tin has a low melting point (about 230 degrees Celsius) and low resistivity. Therefore, the fusible conductive material 321*a* including tin particles has a low melting point and good conductivity, and can maintain conduction of an electrical path when the fuse unit works normally on the embedded substrate 10 and a disconnection function when an excessively large current passes through the embedded substrate 10.

For example, in an optional manner, the fusible conductive material 321*a* may be solder paste. In this way, a shape of the fusible conductive material 321*a* is not fixed before being cured. Therefore, the fusible conductive material 321*a* can be conveniently disposed between the two electrical connection ends 322 in the fuse unit.

When the fusible conductive material 321*a* is disposed, the fusible conductive material 321*a* may be fastened between the two electrical connection ends 322 in a plurality of different manners. Optionally, the fusible conductive material 321*a* may be printed and cured on the surface of the insulation layer 1. In this way, the fusible conductive material 321*a* may be conveniently disposed in a plurality of different shapes and patterns.

Figure 15A:
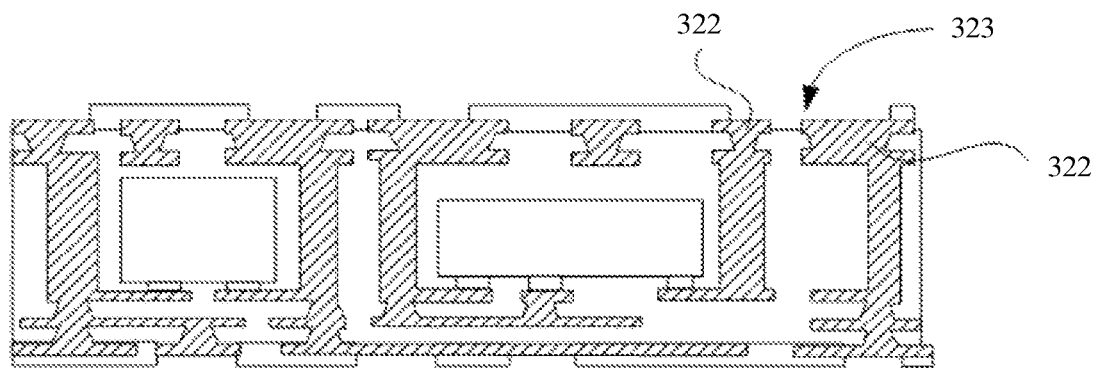
FIG. 15a is a schematic diagram of a step of disposing an accommodating space in a disposing procedure for a fusible conductive material according to an embodiment of this application.
Figure 15B:
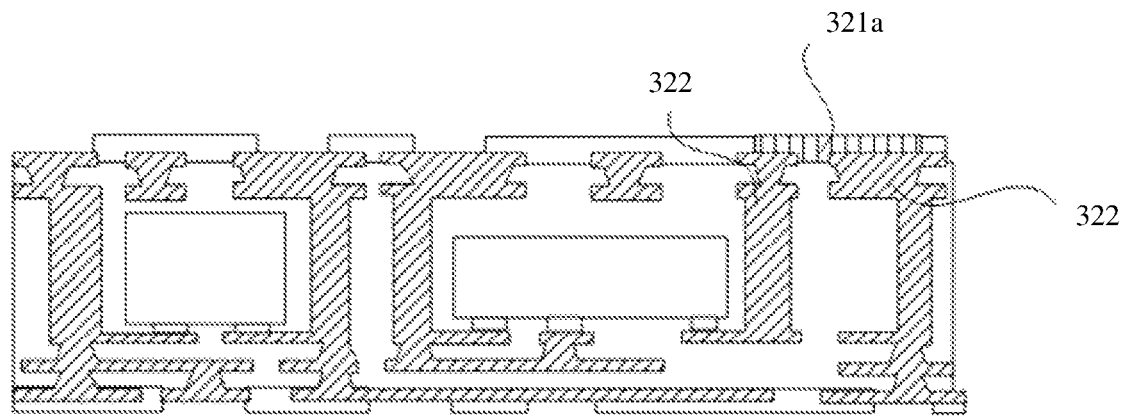
FIG. 15b is a schematic diagram of steps of printing and curing a fusible conductive material in a disposing procedure for a fusible conductive material according to an embodiment of this application.

Specifically, FIG. 15*a* and FIG. 15*b* show processes of disposing the fusible conductive material 321*a*. FIG. 15*a* is a schematic diagram of a step of disposing an accommodating space in a disposing procedure for a fusible conductive material according to an embodiment of this application. As shown in FIG. 15*a*, because the fusible conductive material 321*a* may be a colloidal object including a metal particle, the accommodating space that can be used to accommodate the fusible conductive material 321*a* may be first disposed on a surface of the embedded substrate 10. The accommodating space may be located between the two electrical connection ends 322, for example, the accommodating space may be the roundabout channel 323. FIG. 15*b* is a schematic diagram of steps of printing and curing a fusible conductive material in a disposing procedure for a fusible conductive material according to an embodiment of this application. As shown in FIG. 15*b*, after the accommodating space, for example, the roundabout channel 323, is disposed, the fusible conductive material 321*a* may be printed at a position between the two electrical connection ends 322 in the fuse unit. Finally, the fusible conductive material 321*a* is cured in a curing manner, for example, by using a high temperature, so that the fusible conductive material 321*a* is cured and molded from a colloidal object, to form a structure having a specific hardness and shape.

In this way, the fusible conductive material 321*a* in a form of a colloidal object is laid in the accommodating space in a manner such as printing, and then the fusible conductive material 321*a* is cured and molded. This not only facilitates disposing of the fusible conductive material 321*a*, but also enables the fusible conductive material 321*a* to have a fixed shape after the fusible conductive material 321*a* is cured. Therefore, high working reliability is implemented.

Figure 16:
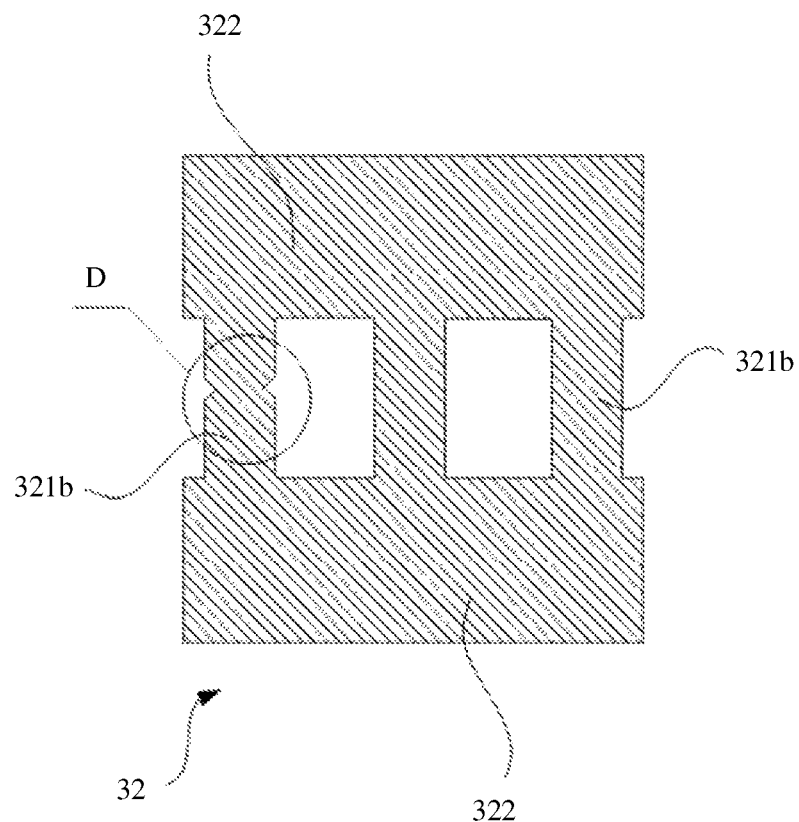
FIG. 16 is another possible schematic diagram of a structure of the fuse unit in FIG. 5 in a direction B.

FIG. 16 is another possible schematic diagram of a structure of the fuse unit in FIG. 5 in a direction B. As shown in FIG. 16, in another implementation of the fusible structure 321, the fusible structure 321 may be a fusible part 321*b* that is integrally connected between the two electrical connection ends 322, and a cross-sectional area of the fusible structure 321 in a direction perpendicular to the electrical path is less than a cross-sectional area of another part of the conductive connector 3 in the direction perpendicular to the electrical path.

In this case, the two electrical connection ends 322 in the fuse unit are not disconnected, but are connected by using the fusible part 321*b*. Therefore, connectivity of an electrical path is maintained between the electrical connection ends 322. However, because a cross-sectional area of the fusible part 321*b* is less than a cross-sectional area of the another part of the conductive connector 3, when a large current passes through the fusible part 321*b*, the fusible part 321*b* is blown earlier than the another part of the conductive connector 3, so that an electrical connection of the embedded substrate 10 is disconnected, to protect the embedded substrate 10 and the entire circuit board.

In an optional manner, the fusible part 321*b* and the electrical connection ends 322 may be of an integrated structure made of a same material, for example, metal. In this case, both of the fusible part 321*b* and the electrical connection ends 322 are metal components.

The fusible part 321*b* may be specifically of a plurality of different structures and in a plurality of different shapes. Optionally, the fusible part 321*b* may be of an arm-shaped structure or a rod-shaped structure connected between the two electrical connection ends 322. In this way, the fusible part 321b has a small cross-sectional area in a direction perpendicular to the electrical path, and the fusible part 321b has a regular shape, to facilitate processing and manufacturing.

When a large current passes through the fusible part 321b, and the fusible part 321b is blown due to heat generated by resistance of the fusible part 321b, the fusible part 321b may also have a partition point, and this is similar to the fusible conductive material 321a. In this way, a phenomenon that the fusible part 321b is re-contacted and connected at a blown position after the fusible part 321b is blown is avoided.

Figure 17:
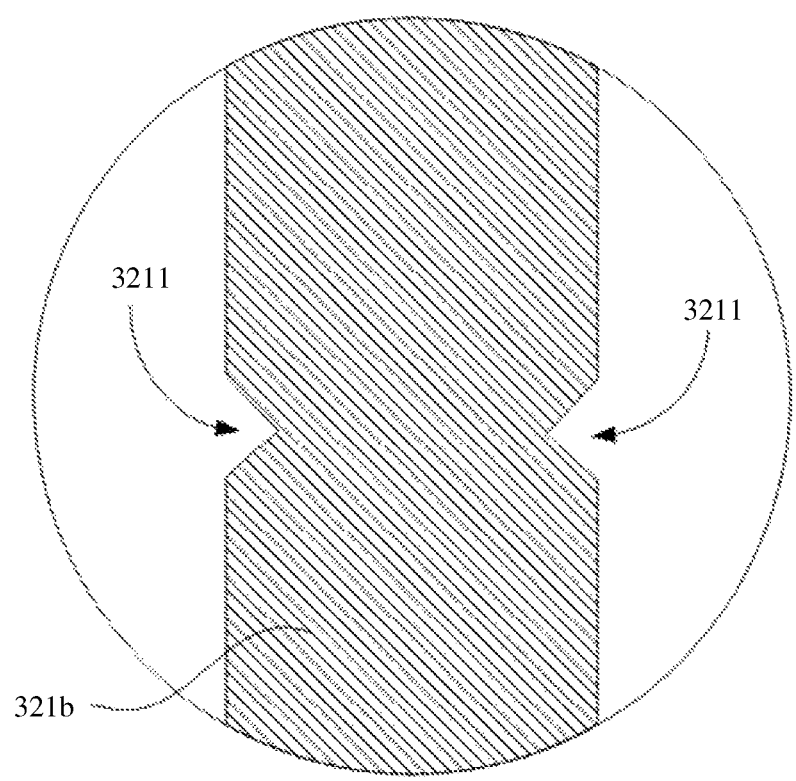
FIG. 17 is a partially enlarged schematic diagram of a position D in FIG. 16.

FIG. 17 is a partially enlarged schematic diagram of a position D in FIG. 16. As shown in FIG. 16 and FIG. 17, in an optional implementation, there may be a nick 3211 on a side of the fusible part 321b, to form a partition point at a position corresponding to the nick 3211 of the fusible part.

Specifically, because resistance of the fusible part 321b is related to a cross-sectional area of the fusible part 321b in a direction perpendicular to the electrical path, when a side of the fusible part 321b has the nick 3211, the nick 3211 has a small cross-sectional area, and correspondingly, resistance of the fusible part 321b at the nick 3211 is large. Therefore, when a large current passes through the electrical path of the fuse unit, the position corresponding to the nick 3211 of the fusible part 321b is first blown, and a shrinkage phenomenon occurs at the nick 3211. In this case, the position corresponding to the nick 3211 of the fusible part 321b shrinks inwards, and the fusible part 321b is not reconnected.

The following specifically describes a manner of disposing and arranging the fuse units in the embedded substrate 10.

The embedded substrate 10 may usually include more than one electronic element 2 such as a chip. In addition, there may be a plurality of different electrical paths in the embedded substrate 10. The electronic elements 2 and electrical paths usually have different safety current thresholds and need to be protected independently. Therefore, to separately protect different electronic elements 2 and different electrical paths in the embedded substrate 10, in an optional manner, the embedded substrate 10 includes at least two fuse units. The fuse units may be connected in parallel to the electrical path of the conductive connector 3. Alternatively, the fuse units are connected in series to the electrical path of the conductive connector 3. Alternatively, the fuse units may be connected in series or in parallel to the electrical path of the conductive connector 3.

To adapt to different electronic elements 2 and safety current thresholds of different electrical paths, optionally, different fuse units may be disposed in different electrical paths, and the fuse units have different preset current thresholds.

To enable different fuse units to have different preset current thresholds, parameters and characteristics of the fusible structures 321 in the different fuse units may be controlled and adjusted, so that fusible structures 321 in the fuse units have specific preset current thresholds. Optionally, the fusible structures 321 in different fuse units may have different parameters, for example, a melting point of the fusible structure 321, a usage amount of the fusible structure 321 in the fuse unit, and the cross-sectional area of the fusible structure 321 in the direction perpendicular to the electrical path. In the foregoing parameters, each fuse unit may have only one parameter that is different from other fuse units, and other parameters are the same. Alternatively, the fuse unit may have at least two parameters that are different from other fuse units.

When melting points of the fusible structures 321 are different, heat required for fusing the fusible structures 321 is also different. For the fusible structure 321 with a low melting point, only a small current is needed, to pass through the fusible structure 321 to generate sufficient heat to fuse the fusible structure 321. For the fusible structure 321 with a high melting point, a large current is needed, to pass through the fusible structure 321 to generate sufficient heat to fuse the fusible structure 321. Therefore, different melting points of the fusible structures 321 can enable the fuse unit to correspondingly have different preset current thresholds.

Similarly, when a usage amount of the fusible structure 321 in the fuse unit is small, heat generated by a small current may fuse the fusible structure 321. When a usage amount of the fusible structure 321 in the fuse unit is large, heat generated by a large current is sufficient to fuse the fusible structure 321.

A cross-sectional area of the fusible structure 321 in a direction perpendicular to the electrical path may limit resistance of the fusible structure 321. When resistance of the fusible structure 321 is large, even if a small current passes through the fusible structure 321, heat generated by the small current is large, and the fusible structure 321 is blown. Therefore, different fusible structures 321 may have different cross-sectional areas in a direction perpendicular to the electrical path, to control resistance of the fusible structures 321 and corresponding preset current thresholds when the fusible structures 321 are blown. In this way, the preset current thresholds corresponding to the fusible structures 321 may be controlled when it is difficult to distinguish a material and a usage amount of the fusible structures 321, for example, when the fusible structure 321 is the fusible part 321b.

Figure 18:
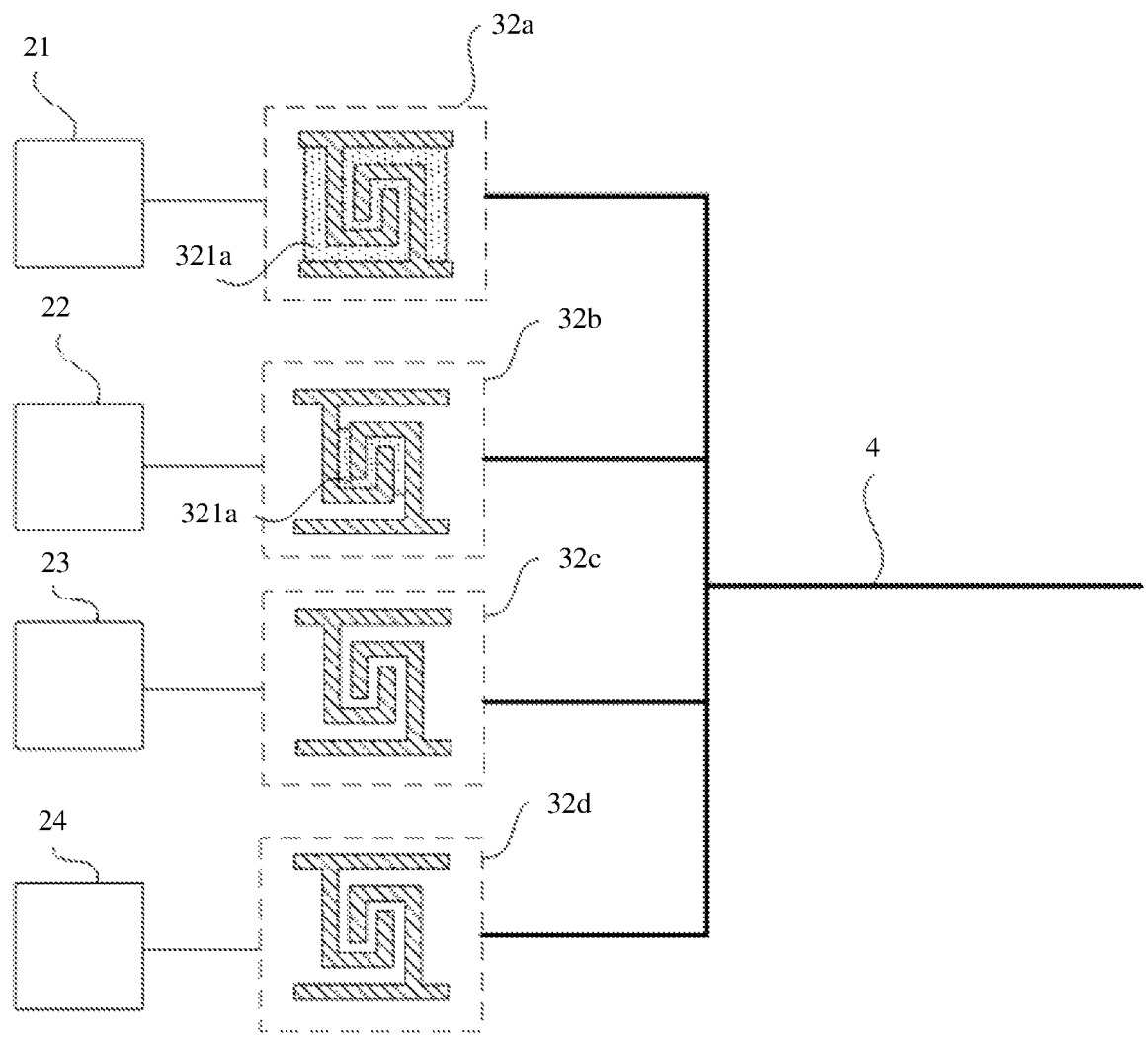
FIG. 18 is a schematic diagram of a possible arrangement manner of fuse units in an embedded substrate according to an embodiment of this application.

FIG. 18 is a schematic diagram of a possible arrangement manner of fuse units in an embedded substrate according to an embodiment of this application. In FIG. 18, for ease of representing an arrangement relationship of the fuse units, a structure of an electrical path 4 formed by the electronic element 2 and the conductive connector 3 is represented in a simplified manner. As shown in FIG. 18, when there are a plurality of fuse units, the fuse units may be connected in parallel in the electrical path 4 formed in the embedded substrate, and different fuse units correspond to different electronic elements 2. To enable different fuse units to have different preset current thresholds, the fusible structures 321 may have different usage amounts in different fuse units. Specifically, a fuse unit 32a, a fuse unit 32b, a fuse unit 32c, and a fuse unit 32d are respectively connected to different chips 21, 22, 23, and 24, and the fuse units are all connected in parallel in the electrical path 4. In this case, different fuse units may have different preset current thresholds and different on-off states. Specifically, both of the fuse unit 32a and the fuse unit 32b have a fusible conductive material 321a, and a usage amount of the fusible conductive material 321a in the fuse unit 32a is different from a usage amount of the fusible conductive material 321a in the fuse unit 32b. However, no fusible conductive material 321a is disposed in the fuse unit 32c and the fuse unit 32d. In this way, the fuse unit 32a and the fuse unit 32b in the embedded substrate may be connected to the electrical path 4 and have a protection function, and the fuse unit 32a and the fuse unit 32b have different preset current thresholds. However, the fuse unit 32c and the fuse unit 32d are not connected to the electrical path 4.

Figure 19:
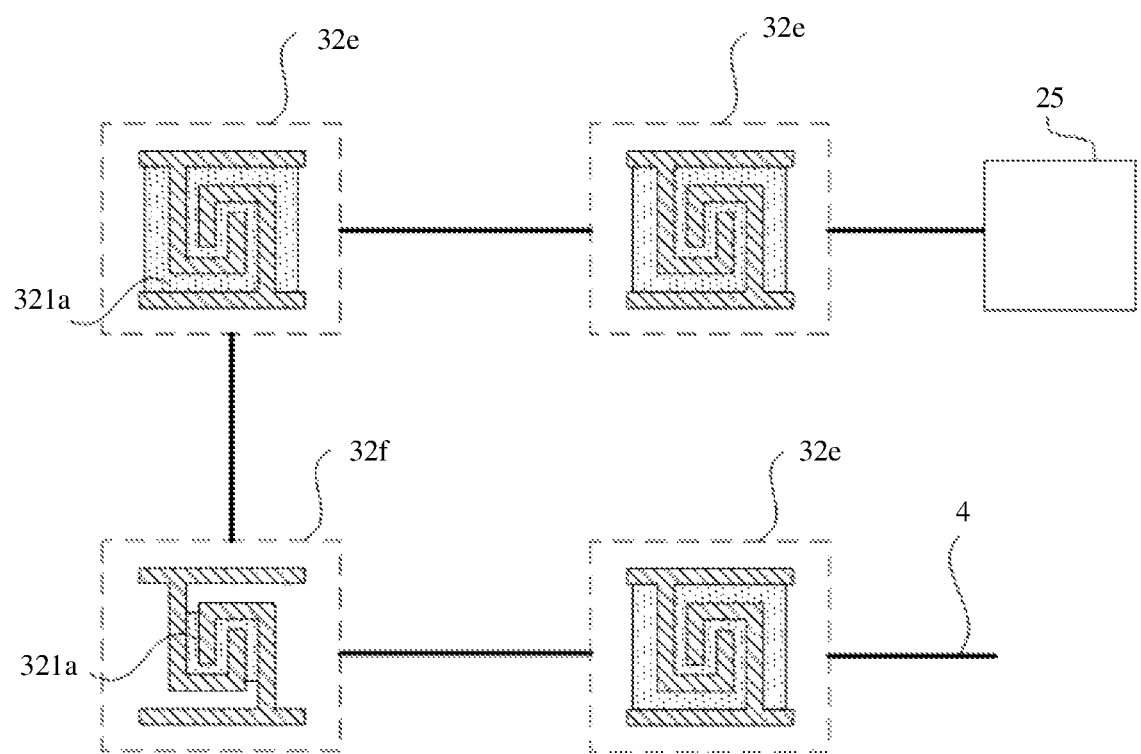
FIG. 19 is a schematic diagram of another possible arrangement manner of fuse units in an embedded substrate according to an embodiment of this application.

FIG. 19 is a schematic diagram of another possible arrangement manner of fuse units in an embedded substrate according to an embodiment of this application. As shown in FIG. 19, when there are a plurality of fuse units, the fuse units may be connected in series in the electrical path 4 of the embedded substrate, to provide an electrical connection for the chip 25. Different fuse units correspond to different usage amounts of the fusible structure 321. Specifically, a usage amount of the fusible conductive material 321a in a fuse unit 32e is greater than a usage amount of the fusible conductive material 321a in a fuse unit 32f. If an excessively large current passes through the electrical path in the embedded substrate 10, the fusible conductive material 321a in a third fuse unit is first blown. In this way, a fusible position in the embedded substrate 10 may be controlled based on different usage amounts of the fusible structure 321 in different fuse units.

In addition, when there are a plurality of fuse units, there may be other different arrangement manners and relative positions, which are not limited herein.

In this embodiment, the circuit board assembly includes the circuit board and the embedded substrate disposed on the circuit board. The embedded substrate includes the insulation layer, the electronic element, and the conductive connector. The electronic element and the conductive connector are embedded inside the insulation layer, the conductive connector is electrically connected to the electronic element, and the conductive connector includes an external connection end for transmitting an electrical signal to the electronic element. The conductive connector includes at least one fuse unit, each of the at least one fuse unit includes a fusible structure and two electrical connection ends, the fusible structure is connected between the two electrical connection ends in a direction of an electrical path of the conductive connector, and the fusible structure is configured to be blown when a passing current exceeds a preset current threshold, to disconnect an electrical connection between the electronic element and the external connection end. In this way, if the embedded substrate is blown due to current overload, only the embedded substrate needs to be repaired or replaced, and another electronic component on the circuit board can still work normally. Therefore, maintenance and replacement costs are low, and a volume of the circuit board is compact.

In addition, this application further provides an electronic device. The electronic device includes the circuit board assembly in the foregoing embodiment. The circuit board assembly includes a circuit board and an embedded substrate disposed on the circuit board. A fuse unit is disposed on the embedded substrate, so that a fusible structure in the fuse unit is blown to protect the embedded substrate and the entire circuit board assembly. For specific structures, functions, and working principles of the circuit board assembly and the embedded substrate, refer to the description in the foregoing embodiments. Details are not described herein again.

Specifically, the electronic device in this application may include but is not limited to a desktop computer, a workbench, a server, a blade server, a mainframe computer, and another suitable computer. The electronic device may further represent various forms of mobile apparatuses such as a mobile phone, a tablet computer, a personal digital assistant (PDA), a point of sales (POS), and a vehicle-mounted computer. Components shown in this application, connections and relationships between the components, and functions of the components are merely used as examples, and are not intended to limit implementations of this application described and/or required in this specification.

In this application, the electronic device includes one or more circuit board assemblies. The circuit board assembly includes a circuit board and an embedded substrate disposed on the circuit board. The embedded substrate includes an insulation layer, an electronic element, and a conductive connector. The electronic element and the conductive connector are embedded inside the insulation layer, the conductive connector is electrically connected to the electronic element, and the conductive connector includes an external connection end for transmitting an electrical signal to the electronic element. The conductive connector includes at least one fuse unit, each of the at least one fuse unit includes a fusible structure and two electrical connection ends, the fusible structure is connected between the two electrical connection ends in a direction of an electrical path of the conductive connector, and the fusible structure is configured to be blown when a passing current exceeds a preset current threshold, to disconnect an electrical connection between the electronic element and the external connection end. In this way, if the embedded substrate is blown due to current overload, only the embedded substrate needs to be repaired or replaced, and another electronic component on the circuit board can still work normally. Therefore, maintenance and replacement costs are low, and a volume of the circuit board is compact.

What is claimed is:

1. An embedded substrate, comprising an insulation layer, an electronic element, and a conductive connector,
    wherein the electronic element and the conductive connector are embedded inside the insulation layer, the conductive connector is electrically connected to the electronic element, and the conductive connector comprises an external connection end for transmitting an electrical signal to the electronic element; and
    the conductive connector comprises at least one fuse unit, each of the at least one fuse unit comprises a fusible structure and two electrical connection ends, the fusible structure is connected between the two electrical connection ends in a direction of an electrical path of the conductive connector, and the fusible structure is configured to be blown when a passing current exceeds a current threshold, to disconnect an electrical connection between the electronic element and the external connection end,
    wherein the insulation layer comprises a first insulation layer and a second insulation layer that are disposed in a stacked manner, and the second insulation layer comprises a hollow area; and the electronic element and the conductive connector are embedded in the first insulation layer, the at least one fuse unit is located on a surface, of the first insulation layer, that faces the second insulation layer, and the at least one fuse unit is exposed in the hollow area.

2. The embedded substrate according to claim 1, wherein the fusible structure is exposed on an outer surface of the insulation layer.

3. The embedded substrate according to claim 1, wherein the fusible structure fills at least a part of the hollow area.

4. The embedded substrate according to claim 1, wherein the fusible structure is a fusible conductive material, the two electrical connection ends are spaced apart in the direction of the electrical path of the conductive connector, and the fusible structure is connected between the two electrical connection ends.

5. The embedded substrate according to claim 4, wherein an accommodating space that is adapted to accommodate the fusible conductive material is formed between the two electrical connection ends in the at least one fuse unit, and the fusible conductive material is disposed in the accommodating space.

6. The embedded substrate according to claim 5, wherein the two electrical connection ends in the at least one fuse unit jointly define the accommodating space.

7. The embedded substrate according to claim 6, wherein two first insulators spaced apart from each other are disposed between the two electrical connection ends, a spacing between the two first insulators is less than a width of a remaining part of the fusible conductive material in the direction of the electrical path, and a part, of the fusible conductive material, that is located between the two first insulators forms a partition point.

8. The embedded substrate according to claim 5, wherein the two electrical connection ends in the at least one fuse unit are disposed opposite to each other; and
    the at least one fuse unit further comprises a second insulator, and the second insulator is provided with the accommodating space connected to the two electrical connection ends.

9. The embedded substrate according to claim 8, wherein the second insulator comprises a protruding part protruding into the accommodating space, so that the fusible conductive material forms a partition point at a position corresponding to the protruding part.

10. The embedded substrate according to claim 5, wherein the accommodating space is a roundabout channel, and the fusible conductive material is at least filled in the roundabout channel.

11. The embedded substrate according to claim 10, wherein the roundabout channel is in a hollow-out shape or a maze shape.

12. The embedded substrate according to claim 4, wherein the fusible conductive material is a colloidal object comprising a metal particle, and a melting point of the metal particle is lower than a melting point of the conductive connector.

13. The embedded substrate according to claim 1, wherein the fusible structure is a fusible part that is integrally connected between the two electrical connection ends, and a cross-sectional area of the fusible structure in a direction perpendicular to the electrical path is less than a cross-sectional area of another part of the conductive connector in the direction perpendicular to the electrical path.

14. The embedded substrate according to claim 13, wherein a nick is provided on a side of the fusible part, to form a partition point at the nick of the fusible part.

15. The embedded substrate according to claim 1, wherein the at least one fuse unit includes at least two fuse units; and the at least two fuse units are connected in parallel to the electrical path of the conductive connector, and/or connected in series to the electrical path of the conductive connector.

16. The embedded substrate according to claim 15, wherein fusible structures in different fuse units of the at least one fuse unit have different current thresholds.

17. The embedded substrate according to claim 16, wherein fusible structures in different fuse units of the at least one fuse unit each have parameters including: a melting point of the fusible structure, a usage amount of the fusible structure, or a cross-sectional area of the fusible structure in the direction perpendicular to the electrical path.

18. The embedded substrate according to claim 1, wherein the insulation layer comprises a first side and a second side that are disposed opposite to each other, the external connection end is located on the first side of the insulation layer, and the at least one fuse unit is located on the second side of the insulation layer.

19. The embedded substrate according to claim 1, wherein the insulation layer further comprises a third insulation layer, the third insulation layer is located on one side, of the first insulation layer, that faces away from the second insulation layer, and the third insulation layer has a hollow area; and the external connection end is located on a surface, of the first insulation layer, that faces the third insulation layer, and is exposed in the hollow area.

20. A circuit board assembly, comprising a circuit board and an embedded substrate including an insulation layer, an electronic element, and a conductive connector,
    wherein the electronic element and the conductive connector are embedded inside the insulation layer, the conductive connector is electrically connected to the electronic element, and the conductive connector comprises an external connection end for transmitting an electrical signal to the electronic element;
    the conductive connector comprises at least one fuse unit, each of the at least one fuse unit comprises a fusible structure and two electrical connection ends, the fusible structure is connected between the two electrical connection ends in a direction of an electrical path of the conductive connector, and the fusible structure is configured to be blown when a passing current exceeds a current threshold, to disconnect an electrical connection between the electronic element and the external connection end; and
    the embedded substrate is disposed on the circuit board, and the external connection end of the conductive connector is electrically connected to the circuit board,
    wherein the insulation layer comprises a first insulation layer and a second insulation layer that are disposed in stacked manner, and the second insulation layer comprises a hollow area; and the electronic element and the conductive connector are embedded in the first insulation layer, the at least one fuse unit is located on a surface, of the first insulation layer, that faces the second insulation layer, and the at least one fuse unit is exposed in the hollow area.

21. The circuit board assembly according to claim 20, wherein the circuit board is a printed circuit board (PCB).

22. The circuit board assembly according to claim 20, wherein the embedded substrate is a power supply configured to supply power to the circuit board.

23. An electronic device, comprising a circuit board assembly including a circuit board and an embedded substrate, wherein the embedded substrate comprises an insulation layer, an electronic element, and a conductive connector, the electronic element and the conductive connector are embedded inside the insulation layer, the conductive connector is electrically connected to the electronic element, and the conductive connector comprises an external connection end for transmitting an electrical signal to the electronic element;
    the conductive connector comprises at least one fuse unit, each of the at least one fuse unit comprises a fusible structure and two electrical connection ends, the fusible structure is connected between the two electrical connection ends in a direction of an electrical path of the conductive connector, and the fusible structure is configured to be blown when a passing current exceeds a current threshold, to disconnect an electrical connection between the electronic element and the external connection end; and the embedded substrate is disposed on the circuit board, and the external connection end of the conductive connector is electrically connected to the circuit board, wherein the insulation layer comprises a first insulation layer and a second insulation layer that are disposed in a stacked manner, and the second insulation layer comprises a hollow area; and the electronic element and the conductive connector are embedded in the first insulation layer, the at least one fuse unit is located on a surface, of the first insulation layer, that faces the second insulation layer, and the at least one fuse unit is exposed in the hollow area.

\* \* \* \* \*